United States Patent [19]

Endo

[11] Patent Number: 5,698,901
[45] Date of Patent: Dec. 16, 1997

[54] SEMICONDUCTOR DEVICE WITH AMORPHOUS CARBON LAYER FOR REDUCING WIRING DELAY

[75] Inventor: Kazuhiko Endo, Tokyo, Japan

[73] Assignee: NEC Corporation, Tokyo, Japan

[21] Appl. No.: 526,902

[22] Filed: Sep. 12, 1995

[30] Foreign Application Priority Data

| | | | |
|---|---|---|---|
| Sep. 12, 1994 | [JP] | Japan | 6-217470 |
| Feb. 9, 1995 | [JP] | Japan | 7-021429 |
| Feb. 23, 1995 | [JP] | Japan | 7-035023 |
| Mar. 23, 1995 | [JP] | Japan | 7-064066 |

[51] Int. Cl.$^6$ ............... H01L 21/3115; H01L 21/312
[52] U.S. Cl. ............... 257/758; 257/642; 257/646; 257/759; 257/760
[58] Field of Search ............... 257/77, 646, 636, 257/642, 758-760

[56] References Cited

U.S. PATENT DOCUMENTS

| | | | |
|---|---|---|---|
| 5,011,706 | 4/1991 | Tarhay et al. | 427/39 |
| 5,017,403 | 5/1991 | Pang et al. | 427/39 |
| 5,155,576 | 10/1992 | Mizushima | 257/759 |
| 5,198,263 | 3/1993 | Stafford et al. | 427/577 |
| 5,306,947 | 4/1994 | Adachi et al. | 257/759 |
| 5,395,796 | 3/1995 | Haskell et al. | 437/195 |
| 5,422,237 | 6/1995 | Hughes et al. | 257/759 |
| 5,442,237 | 8/1995 | Hughes et al. | 257/759 |
| 5,559,367 | 9/1996 | Cohen et al. | 257/77 |

FOREIGN PATENT DOCUMENTS

| | | | |
|---|---|---|---|
| 0696819 | 2/1996 | European Pat. Off. | |
| 0208852 | 10/1985 | Japan | 257/758 |
| 0087047 | 4/1991 | Japan | |
| 0174912 | 6/1992 | Japan | |

OTHER PUBLICATIONS

Patent Abstracts of Japan, Abstract of JP-A 5-074960 Fujitsu, Ltd. vol. 17, No. 401, (E-1404).

K. Endo et al., "Preparation and Properties of Fluorinated Amorphous Carbon Thin Films by Plasma Enhanced Chemical Vapor Deposition," *Mat. Res. Soc. Symp. Proc.*, vol. 381, pp. 249–254 (1995).

K. Endo and T. Tatsumi, "Plasma Fluorination of Polyimide", 55th Meeting of Applied Physics Institution, No. 3, 21a–G–11, Sep. 19, 1994, p. 1034.

R. d'Agostino et al., "Mechanisms of etching and polymerization in radiofrequency discharges of $CF_4$–$H_2$, $CF_4$–$C_2F_4$, $C_2F_6$–$H_2$, $C_3F_8$–$H_2$", *J. Appl. Phys.*, vol. 54, No. 3, Mar. 1983, pp. 1284–1288.

N. Amyot et al., "Electrical and Structural Studies of Plasma–polymerized Fluorocarbon Films", *IEEE Transactions on Electrical Insulation*, vol. 27, No. 6, Dec. 1992, pp. 1101–1107.

S.W. Pang et al., "Plasma–deposited amorphous carbon films as planarization layers", *J. Vac. Sci. Technol.*, vol. B8, No. 6, Nov./Dec. 1990, pp. 1980–1984.

Primary Examiner—Peter Toby Brown
Attorney, Agent, or Firm—Sughrue,Mion,Zinn,Macpeak & Seas

[57] ABSTRACT

The invention provides a semiconductor device in which interlayer insulative layers are composed of amorphous carbon film. The amorphous carbon film may include fluorine (F) therein. The invention further provides a method of fabricating a semiconductor device including an interlayer insulative layer composed of amorphous carbon film including fluorine (F), the method having the step of carrying out plasma-enhanced chemical vapor deposition (PCVD) using a mixture gas including (a) at least one of $CF_4$, $C_2F_6$, $C_3F_8$, $C_4F_8$ and $CHF_3$, and (b) at least one of $N_2$, NO, $NO_2$, $NH_3$ and $NF_3$. The method provides amorphous carbon film having superior heat resistance and etching characteristics. By composing interlayer insulative layers of a semiconductor device of the amorphous carbon film, the semiconductor device can operate at higher speed.

12 Claims, 21 Drawing Sheets

1: HIGH FREQUENCY 100W
2: HIGH FREQUENCY 200W
3: HIGH FREQUENCY 300W

1: NO NITROGEN
2: NITROGEN CONTENT 5%
3: NITROGEN CONTENT 15%

1: DIELECTRIC CONSTANT PRIOR TO HEAT TREATMENT
2: DIELECTRIC CONSTANT AFTER 300°C HEAT TREATMENT

1: HIGH FREQUENCY 100 W
2: HIGH FREQUENCY 200 W
3: HIGH FREQUENCY 250 W

1: NO SILICON
2: SILICON CONTENT 10%
3: SILICON CONTENT 20%

1: DIELECTRIC CONSTANT PRIOR TO HEAT TREATMENT
2: DIELECTRIC CONSTANT AFTER 300°C HEAT TREATMENT

1: Si - CONTAINING FILM
2: N - CONTAINING FILM

1: Si-CONTAINING FILM
2: N-CONTAINING FILM

1: C CONTENT
2: Si CONTENT

1: CF₄ GAS USED
2: C₂F₆ GAS USED

1: $CF_4$ GAS USED
2: $C_2F_6$ GAS USED

1: HELICON WAVE
2: MICROWAVE

SEMICONDUCTOR DEVICE WITH AMORPHOUS CARBON LAYER FOR REDUCING WIRING DELAY

BACKGROUND OF THE INVENTION

1. Field of the Invention

The invention relates to a semiconductor device, and more particularly to a semiconductor device including interlayer insulative layers composed of insulative material having a low dielectric constant to thereby reduce wire delay and hence make it possible for a semiconductor device to operate at higher speed than a conventional semiconductor device. The invention also relates to a method of fabricating such a semiconductor device.

2. Description of the Related Art

With the demand of decreasing wiring width and a spacing between wirings in a semiconductor device, wire floating capacitance and wire resistance in a semiconductor device are increased with the result of increase of wire delay which is an obstacle to higher speed operation of a semiconductor device. Thus, for the purpose of decreasing wire delay, it is presently attempted to improve insulative material to be used for multiple wiring layers. Since wire delay is in general in proportion to a root of a dielectric constant of the insulative material, wire delay can be decreased by composing multiple wiring layers of insulative material having a low dielectric constant. Interlayer insulative films are presently composed of $SiO_2$ and the like which has a dielectric constant of about 4, and it is now desired to develop insulative material having a dielectric constant of 3 or smaller. For this purpose, an attempt is being made to provide insulative material having a low dielectric constant such as SiOF film composed of $SiO_2$ containing fluorine (F) to thereby reduce a dielectric constant, and organic material such as polyimide having a smaller dielectric constant than that of inorganic material such as $SiO_2$.

For instance, the inventor had published a paper on plasma fluorination of polyimide in 55th Meeting of Applied Physics Institution, No. 3. 21a-G-11, Sep. 19, 1994. The fluorinated polyimide has a dielectric constant of 3 or smaller. It should be noted that the applicant does not admit the article No. 3. 21a-G-11 as prior art. This article is cited herein solely for better understanding of the background of the invention.

For another instance, Japanese Unexamined Patent Public Disclosure No. 4-174912 laid open on Jun. 23, 1992 has suggested a cable comprising a linear conductor having a diameter of 1 mm or less, and a plasma polymerized insulative film covering around the conductor, which film has a dielectric constant of 3 or smaller.

Still another instance is an article entitled "Mechanisms of etching and polymerization in radiofrequency discharges of $CF_4-H_2$, $CF_4-C_2F_4$, $C_2F_6-H_2$, $C_3F_8-H_2$" reported by R. d'Agostino, F. Cramarossa, V. Colaprico, and R. d'Ettole through American Institute of Physics in J. Appl. Phys. 54(3), pp 1284–1288, March 1983. This report has reported some results obtained during the etching of Si or the deposition of fluorocarbon films over Si substrates uncoupled from ground in rf plasmas fed with $CF_4-H_2$, $C_2F_6-H_2$, $C_3F_8-H_2$ and $CF_4-C_2F_4$ mixtures.

Yet another instance is an article entitled "Electrical and Structural Studies of Plasma-polymerized Fluorocarbon Films" reported by N. Amyot, J. E. Klemberg-Sapieha, and M. R. Wefthelmet in IEEE Transactions on Electrical Insulation, Vol. 27 No. 6, pp 1101–1107, December 1992. In this study, plasma-polymerized fluorocarbon films up to 8 μm in thickness have been prepared by high frequency glow discharge deposition to investigate the material's charge storage (electret) properties. Under 'mild' plasma conditions, materials with high fluorine concentration (F/C<1.9) could be obtained, while films with lower F/C were found to be partially oxidized.

Still yet another instance is an article entitled "Plasma-deposited amorphous carbon films as planarization layers" reported by S. W. Pang and M. W. Horn through American Vacuum Society in J. Vac. Sci. Technol. B8(6), pp1980–1984, November/December 1990. According to the report, a dry planarization process was developed that utilizes plasma-enhanced chemical vapor deposition of amorphous carbon films. The characteristics of the films depend on deposition conditions such as source gas composition, rf power, degree of ion bombardment, temperature, pressure, and electrode spacing. Planar films were deposited at low temperatures (<50° C.) with low ion bombardment energy (<10 V) and high deposition rates (100–300 nm/min).

However, $SiO_2$ containing fluorine therein does not exhibit sufficient decrease of a dielectric constant, and merely exhibits a dielectric constant of about 3. In addition, an interlayer insulative film composed of $SiO_2$ containing fluorine has a problem with respect to hygroscopic property thereof. On the other hand, an interlayer insulative film composed of the polyimide resin also has problems that such a film has a low upper limitation with respect to heat resistance, specifically, the heat resistance of the film is just about 400 degrees centigrade, and that humidity present in the film exerts a bad influence on a semiconductor device in wet processes, and further that volumetric shrinkage which occurs while the polyimide resin is being cured may causes the film to be cracked.

SUMMARY OF THE INVENTION

It is an object of the present invention to provide a semiconductor device including interlayer insulative layers composed of insulative material having a low dielectric constant.

Another object of the present invention is to provide a method of fabricating the above mentioned semiconductor device.

The invention provides a semiconductor device in which interlayer insulative layers are composed of amorphous carbon film. This amorphous carbon film is insulative material which exhibits a dielectric constant of 3 or smaller even if it contains no fluorine (F).

The amorphous carbon film may include fluorine (F) therein. By addition of fluorine to the amorphous carbon film, it is possible to reduce a dielectric constant down to 2.5 or smaller. The amorphous carbon film has a structure in which carbon atoms are cross-linked in high degree. This structure ensures higher heat resistance than polyimide and no humidity to occur in the amorphous carbon film during polymerization.

It is possible to decrease wire delay without degrading reliability of a semiconductor device by composing interlayer insulative layers of a semiconductor device of the amorphous carbon film.

The amorphous carbon film is formed by making monomer molecules of hydrocarbon into plasmatic condition to thereby producing radical molecules and ions of carbon, and activating such carbon radical molecules and ions on a semiconductor substrate. Monomer molecules to be used include hydrocarbon family gas such as $CH_4$, $C_2F_4$ and $C_2H_2$, and naphthalene molecules in solid or liquid phase.

In order to fluorinate the amorphous carbon film, fluorine family gas such as $CF_4$, $C_2F_8$, $C_2F_4$, $C_2F_2$ and $SF_6$ are also used together with the above mentioned hydrocarbon family gas. From these fluorine family gas are produced fluorine radicals and ions through plasma to thereby add fluorine (F) into the amorphous carbon film.

If there exists fluorine (F) on an interface between the amorphous carbon film and an underlying layer disposed below the amorphous carbon film, cohesion of the amorphous carbon film with the underlying layer is deteriorated with the result that the amorphous carbon film is prone to be peeled off. Thus, it is preferable that the content of fluorine (F) has a distribution in a depthwise direction of the amorphous carbon film. More specifically, it is preferable that the distribution is designed so that no fluorine (F) is present at an interface between the amorphous carbon film and the underlying layer disposed below the amorphous carbon film.

FIGS. 1A and 1B illustrates a bipolar transistor and a MOS type field effect transistor (MOSFET), respectively, in each of which an interlayer insulative layer is composed of the fluorinated amorphous carbon film.

The bipolar transistor illustrated in FIG. 1A has a p type semiconductor substrate 11 in which an $n^+$ type diffusion layer 9 is formed. On the $n^+$ type diffusion layer 9 is formed an n type layer 8 by epitaxy, and adjacent to the n type layer 8 is formed a $p^+$ type isolation layer 10 by ion implantation. On the epitaxial layer 8 is formed a p type layer 7 serving as a base, and adjacent to the p type layer 7 is formed an $n^+$ type emitter layer 6. An $n^+$ type layer 5 is formed for connecting the $n^+$ type diffusion layer 9 with an $n^+$ type polysilicon electrode 4 serving as a collector. On the $n^+$ type emitter layer 6 is formed a metal electrode 2 serving as a gate. The amorphous carbon film or fluorinated amorphous carbon film is used as an interlayer insulative layer for covering active regions and wiring electrodes in the bipolar transistor.

A semiconductor device constructed as MOSFET illustrated in FIG. 1B has a p type semiconductor substrate 11 on which field $SiO_2$ oxidation films 16 are formed except areas which would be used as active regions. In the active regions are formed a source 14 and a drain 15 by ion implantation. Centrally between the source 14 and the drain 15 is formed a gate electrode 13 on a thin $SiO_2$ film (not illustrated), which electrode 13 is composed of polysilicon. The amorphous carbon film is deposited so that it fully covers these contacts.

The above mentioned amorphous carbon film containing fluorine therein exhibits a dielectric constant of about 2.1. Though this amorphous carbon film has a sufficiently low dielectric constant, it has smaller heat resistance temperature than $SiO_2$, resulting in that the fluorinated amorphous carbon film can have only limited range of uses. For instance, the amorphous carbon film containing fluorine therein begins to be thermally decomposed at about 420 degrees centigrade with the result of decrease in film thickness and gas generation. Thus, it is necessary to keep heat treatment temperature below 420 degrees centigrade when the amorphous carbon film is to be used. However, a semiconductor device fabrication process often needs heat treatment at high temperature, and hence it is necessary to modify the amorphous carbon film so that it can withstand heat treatment at temperature of at smallest 450 degrees centigrade.

This can be accomplished by introducing another atoms into a fluorinated amorphous carbon film. Since the fluorinated amorphous carbon film is formed by using carbon fluoride family gas or a mixture gas of fluorine family gas and hydrogen gas, the fluorinated amorphous carbon film in general contains carbon, fluorine and hydrogen atoms. The carbon atoms make carbon-carbon bonds in the film to thereby form a core of the film. The fluorine atoms decrease a dielectric constant of the film. The hydrogen atoms have a function of terminating non-bonding orbits in the film. By introducing nitrogen atoms or silicon atoms into the amorphous carbon film, there are produced strong bonds such as carbon-nitrogen and carbon-silicon in the amorphous carbon film to thereby increase cross-linking degree of the film, which in turn enhances heat-resistance and etching resistance of the film.

Thus, the invention further provides the amorphous carbon film including fluorine, (F) and further nitrogen (N). The amorphous carbon film may include silicon (Si) in place of nitrogen.

The invention still further provides a semiconductor device in which interlayer insulative layers are composed of amorphous carbon film and which includes a buffer layer for suppressing gas discharge out of the amorphous carbon film, the buffer layer disposed between the amorphous carbon film and elements of the semiconductor device disposed adjacent to the amorphous carbon film. Herein, the elements of the semiconductor device means, for instance, an electrode, a wiring and a transistor section.

In a preferred embodiment, the semiconductor device further includes a transition layer interposed between the amorphous carbon film and the buffer layer, the transition layer having a composition gradually varying from a composition of the amorphous carbon film to a composition of the buffer layer.

In another preferred embodiment, the buffer layer has a smaller thickness than that of the amorphous carbon film. The thickness of the buffer layer is determined in accordance with temperature of heat treatment to be carried out in fabrication of the semiconductor device.

Thus, a semiconductor device in accordance with an embodiment of the invention includes a buffer layer interposed between the amorphous carbon film and elements such as electrodes and wirings. The buffer layer suppresses gas discharge out of the amorphous carbon film in heat treatment process, and hence provides a semiconductor device which can withstand heat treatment at higher temperature. Material of which the buffer layer is composed may be selected from $SiO_2$, $Si_3N_4$, amorphous carbon film including silicon therein, or amorphous carbon film including nitrogen therein.

It should be noted that material of which the buffer layer is composed is not limited to the above mentioned ones. Any material may be selected if it is highly densified so that it can interrupt gas discharged out of an amorphous carbon film from breaking out therethrough. In general, such material has a greater dielectric constant than that of an amorphous carbon film. For instance, $SiO_2$, $Si_3N_4$, and an amorphous carbon film containing nitrogen or silicon have a dielectric constant of 4, 7 and 3, respectively. However, as aforementioned, by forming the buffer layer in a smaller thickness than that of the amorphous carbon film, it is possible to reduce a dielectric constant of the amorphous carbon film containing the buffer layer down to a dielectric constant of an amorphous carbon film containing no buffer layer.

The invention still further provides a method of fabricating amorphous carbon film including fluorine (F), of which an interlayer insulative layer of a semiconductor device is to be composed, which method including the step of carrying out plasma-enhanced chemical vapor deposition (PCVD) using CxFy gas, wherein x is an integer ranging from 1 to 4 both inclusive, and y is an integer ranging from 4 to 8 both inclusive, so that a substrate on which the amorphous carbon film is to be deposited is disposed outside an area in which plasma is generated.

The invention yet further provides a method of fabricating amorphous carbon film including fluorine (F), of which an interlayer insulative layer of a semiconductor device is to be composed, the method including the step of carrying out plasma-enhanced chemical vapor deposition (PCVD) using CxFy gas, wherein x is an integer ranging from 1 to 4 both inclusive, and y is an integer ranging from 4 to 8 both inclusive, so that a substrate on which the amorphous carbon film is to be deposited is disposed outside an area in which plasma is generated, and providing high-frequency electric power with the substrate while PCVD is being carried out.

The reason why the above mentioned methods are provided is as follows. Interlayer insulative material for isolating wirings from one another is required to have a dielectric constant which is reduced possibly to the smallest, an ability with which the material sufficiently fills sparing between patterned wirings, and deposition speed of at least about 0.1 μm/min in order to increase fabrication efficiency per unit time. The presently used $SiO_2$ interlayer insulative layer can satisfy the requirements with respect to space-filling property and deposition speed among the properties required to the insulative material, by using highly densified plasma and further applying a bias voltage to a semiconductor substrate. However, the $SiO_2$ interlayer insulative layer can merely have a dielectric constant of about 4, and it is quite difficult to decrease a dielectric constant to the range smaller than 4. If a fluorinated amorphous carbon film is to be used as another insulative material, it is possible to decrease a dielectric constant to the range of 3 or smaller, but an interlayer insulative layer composed of a fluorinated amorphous carbon film is inferior to the $SiO_2$ layer with respect to the film deposition speed and planarization obtained after spacings of patterned wirings are filled with the film.

The reason why a conventional fluorinated amorphous carbon film has slower film deposition speed and inferior planarization of patterned wirings is that since film deposition is performed by low densified plasma, monomer as raw material is decomposed through plasma in smaller speed, and hence density of fluorinated carbon radicals contributing to film deposition is small. For this reason, it takes more than 30 minutes to deposit a 1 μm thickness film. Thus, it is necessary to make the deposition speed to be two times or more greater for practical use. In addition, conventional parallel flat plate type low densified plasma cannot deposit an amorphous carbon film only by using carbon fluoride gas. It was necessary to add hydrogen gas when a film is to be deposited. The added hydrogen atoms make a bond with carbon atoms, and thus become a part of the film. The hydrogen atoms present in the film degrade the cross-linking degree of the film with the result of deterioration of heat resistance of the film. Accordingly, it is now desired to develop a process in which film deposition can be performed without addition of hydrogen. Film structure of an amorphous carbon film is remarkably changed by ion irradiation. In a conventional parallel flat plate type low densified plasma, since irradiated ions have large amounts of energy because of self-bias to be applied to a substrate, it is difficult in principle to control ion energy so that the ion energy is kept in an optimal value for amorphous carbon film deposition, resulting in deterioration of planarization of patterned wirings.

The problem as mentioned above is overcome with the methods in accordance with the invention. In the method in accordance with the invention, highly densified plasma is used in order to increase radical density which contributes to film deposition speed. In addition, since a semiconductor substrate is disposed outside an area in which plasma is generated, it is possible to decrease ion energy to be irradiated onto a semiconductor substrate, and hence it is also possible to deposit a fluorinated amorphous carbon film without addition of hydrogen. Furthermore, in the method in accordance with the invention, a high-frequency voltage is applied to a semiconductor substrate on which the amorphous carbon film is to be deposited, and thus a voltage of the substrate is optimized, thereby making it possible to vary ion energy and control film quality such as heat resistance and planarization.

The fluorinated amorphous carbon film to be fabricated in accordance with the invention is formed by exciting fluorinated carbon family monomer molecules through plasma, such as $CF_4$, $C_2F_6$, $C_3F_8$ and $C_4F_8$, and activating the thus generated radical molecules and ions on a semiconductor substrate. Film deposition through plasma is in general considered to occur due to a combination of deposition reaction of radicals having deposition characteristic, and etching reaction caused by ions or radicals having etching property. If highly densified plasma is used as plasma source, density of fluorinated carbon radicals having deposition property is increased, since decomposition speed of monomer molecules are increased relative to a parallel flat plate type plasma generator. Hence, film deposition is facilitated with the result of higher film deposition speed.

In a conventional parallel flat plate type plasma, since ions are accelerated by self-bias voltage applied to a semiconductor substrate, etching carried out by ion irradiation is facilitated. Accordingly, if plasma is generated only with CF family gas, etching speed becomes greater than film deposition speed, and hence deposition of fluorinated amorphous carbon film can not occur. In order to deposit the amorphous carbon film, fluorine atoms considered to serve as an etcher have to be removed by adding hydrogen gas and the like.

In the method in accordance with the invention, highly densified plasma such as helicon wave discharge and microwave discharge is used, and in addition, an area in which plasma is to be produced is separate from an area in which film deposition is performed. This makes it possible to make ion energy small regardless of high ion density. In these highly densified plasma sources, etching is suppressed, and thus film deposition can be performed without addition of hydrogen gas. Hence, it is now possible to remove hydrogen atoms which have been present in an amorphous carbon film in conventional parallel flat plate type plasma and have degraded heat resistance of the amorphous carbon film. In addition, since a voltage of a substrate is controlled by applying a high-frequency electric power thereto, irradiation ion energy is optimized with the result of enhancement of heat resistance and planarization of the film.

The invention further provides a method of fabricating amorphous carbon film including fluorine (F), of which an interlayer insulative layer of a semiconductor device is to be composed, which method including the step of carrying out plasma-enhanced chemical vapor deposition (PCVD) using a mixture gas including (a) at least one of $CF_4$, $C_2F_6$, $C_3F_8$, $C_4F_8$ and $CHF_3$, and (b) at least one of $N_2$, NO, $NO_2$, $NH_3$ and $NF_3$.

In a preferred embodiment, the mixture gas further includes (c) at least one of $H_2$, $CH_4$, $C_2H_6$, $C_2H_4$, $C_2H_2$, and $C_3H_8$.

The invention still further provides a method of fabricating amorphous carbon film including fluorine (F), of which an interlayer insulative layer of a semiconductor device is to be composed, which method comprising the step of carrying out plasma-enhanced chemical vapor deposition (PCVD) using a mixture gas including (a) at least one of $CF_4$, $C_2F_6$, $C_3F_8$, $C_4F_8$ and $CHF_3$, and (b) at least one of $SiH_4$, $SiH_6$, and $SiF_4$.

In a preferred embodiment, the mixture gas further includes (c) at least one of $H_2$, $CH_4$, $C_2H_6$, $C_2H_4$, $C_2H_2$, and $C_3H_8$.

The above mentioned amorphous carbon fill containing fluorine therein exhibits a dielectric constant of about 2.1. Though this amorphous carbon film has a sufficiently low dielectric constant, it has smaller heat resistance temperature than $SiO_2$, resulting in that it can have only limited range of use. For instance, the amorphous carbon film containing fluorine therein begins to be thermally decomposed at about 420 degrees centigrade with the result of decrease in film thickness and gas generation. Thus, it is necessary to keep heat treatment temperature below 420 degrees centigrade when the amorphous carbon film is to be used.

When the amorphous carbon film is to be used for interlayer insulative material, it is necessary to carry out patterning by means of conventional lithography. However, since the amorphous carbon material consists mainly of carbon similarly to resist used in lithography, even if it is etched with CF4 or CHF3 gas, it is impossible to make a selection ratio between etching and resist greater. For instance, when an amorphous carbon film having a thickness of 1 μm is to be patterned, resist has to be covered over the amorphous carbon film by about 2 μm or greater. In addition, when resist is to be removed, the resist is ashed generally by oxygen plasma. However, since the amorphous carbon film is also ashed together with the amorphous carbon film, the amorphous carbon film has to have a structure which is difficult to be etched by oxygen plasma.

Such a structure is accomplished by introducing another atoms into fluorinated amorphous carbon film. Since the fluorinated amorphous carbon film is formed by using carbon fluoride family gas or a mixture gas of fluorine family gas and hydrogen gas, the fluorinated amorphous carbon film in general contains carbon, fluorine and hydrogen atoms. The carbon atoms make carbon-carbon bonds in the film to thereby form a core of the film. The fluorine atoms decrease a dielectric constant of the film. The hydrogen atoms have a function of terminating non-bonding orbits in the film. By introducing nitrogen atoms or silicon atoms into the amorphous carbon film, there are produced strong bonds such as carbon-nitrogen and carbon-silicon in the amorphous carbon film to thereby increase cross-linking degree of the film, which in turn enhances heat-resistance and etching resistance of the film.

The factor which determines heat-resistance of a film composed of carbon is a cross-linking structure of the film. Herein, the cross-linking structure means a structure in which carbon-carbon bonds exist in random in a film in question. Conventional fluororesin has a structure represented by a formula $(CF_2)n$, that is, a structure in which carbon-carbon bonds extend like a chain. In such a structure, chain-like molecules are bonded by Van der Waals forces, and thus fluororesin does not have a cross-linking structure. For this reason, fluororesin begins its thermal decomposition at 300 degrees centigrade. Thus, fluororesin has a low heat-resistance. However, since an amorphous carbon film is in general deposited by dissociating hydrogen fluoride family gas by plasma, carbon-carbon bonds distribute in random in the film. Thus, the amorphous carbon film has a cross-linking structure, and hence can have greater heat-resistance than that of fluororesin. Specifically, components of the film begins to be desorbed at about 420 degrees centigrade. It is considered that the desorption of the film components out of the fluorinated amorphous carbon film occurs because side chains, which are present in the film, such as —$CF_3$ or —$(CF_2)n$—$CF_3$ are made broken at about 420 degrees centigrade.

If these side chains can be bundled with new bonds to thereby increase the cross-linking degree, it is possible to raise desorption temperature. In the method in accordance with the invention, other atoms are introduced into the film to bundle side chains to thereby increase the cross-linking degree. Any atoms may be selected for increasing the cross-linking degree, if they can be supplied in gas phase, they can form covalent bonds with carbon atoms, and a resultant containing them can maintain insulating property. In the method in accordance with the invention, either nitrogen atoms having three configuration or silicon atoms having four configuration is added into the film so that these atoms make bonds with carbon atoms to newly generate a cross-linking structure in a side-chain having a low degree of cross-linking. In addition, it is possible to make oxygen plasma etching speed smaller than that of an or dreary amorphous carbon film by utilizing the fact that carbon-silicon bond and carbon-nitrogen bond have a greater bonding force than that of carbon-carbon bond. Thus, even if resist is ashed, the amorphous carbon film would not be ashed. Furthermore, when an amorphous carbon film is to be etched with carbon fluoride family gas in patterning, it is possible to raise etching speed up to $SiO_2$ etching speed by adding silicon into the film, resulting in that patterning steps which are the same as those for patterning $SiO_2$ are able to be used.

The advantages obtained by the aforementioned present invention will be described hereinbelow.

As having been described, it is now possible to make a semiconductor device operate at higher speed without deteriorating reliability by composing an interlayer insulative layer of an amorphous carbon film, an amorphous carbon film containing fluorine (F) therein, or an amorphous carbon film containing fluorine and nitrogen (N) or silicon (Si).

Furthermore, by forming a thin buffer layer bet-ween the amorphous carbon film and elements such as electrodes and wirings for suppressing gas discharge out of the amorphous carbon film which is to occur when the amorphous carbon film is subject to heat treatment, it is possible to prevent degradation of electrodes, wirings, etc. due to the gas discharge from the amorphous carbon film, and hence also possible to provided a semiconductor device having high heat resistance.

The amorphous carbon film fabricated in accordance with the method of the present invention has superior heat resistance and etching characteristics. Thus, by composing an interlayer insulative film of a semiconductor device of the amorphous carbon film, it is possible to make a semiconductor device operate at higher speed without deteriorating reliability.

In addition, the method, in which a substrate on which the amorphous carbon film is to be deposited is disposed outside an area in which plasma is generated, makes it possible to form a fluorinated amorphous carbon film containing no hydrogen. Furthermore, by providing high-frequency electric power with the substrate while PCVD is being carried out, it is possible to optimize ion energy and hence form an amorphous carbon film having high heat resistance.

The above and other objects and advantageous features of the present invention will be made apparent from the following description made with reference to fie accompanying drawings, in which like reference characters designate fie same or similar parts throughout the drawings.

DESCRIPTION OF THE PREFERRED EMBODIMENTS

Preferred embodiments in accordance with the present invention will be explained hereinbelow with reference to drawings.

Figure 2:
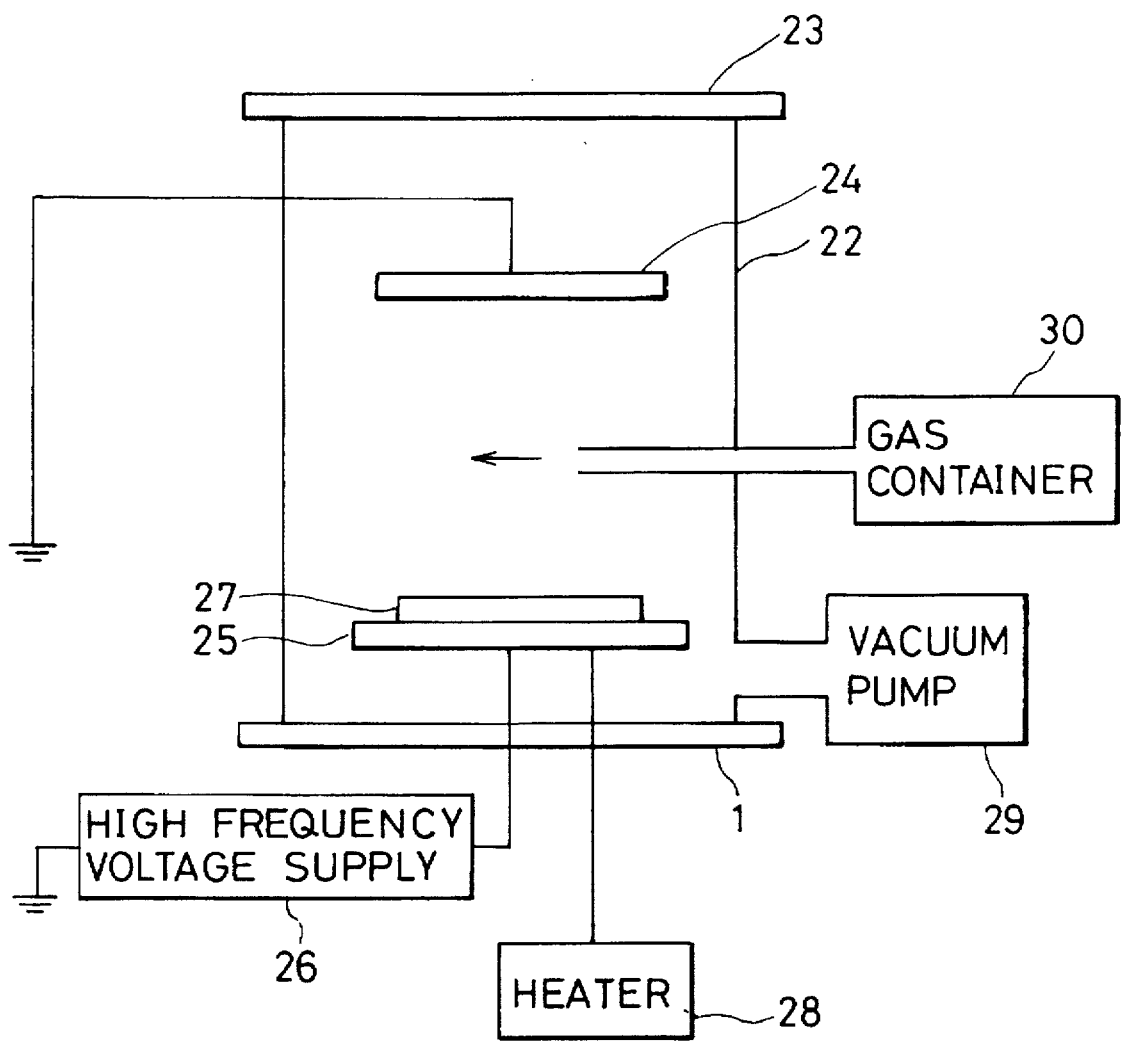
FIG. 2 is a schematic view illustrating an apparatus for depositing the fluorinated amorphous carbon film containing nitrogen or silicon.

FIG. 2 illustrates an apparatus for forming an amorphous carbon film containing fluorine therein. The apparatus includes a support plate 1 on which is formed a vacuum chamber 22 having a top cover 23 for hermetically sealing of the chamber 22. In the vacuum chamber 22 are disposed an upper electrode 24 and a lower electrode 25 in facing relation to each other. A high frequency voltage supply 26 applies dc or ac electric power across the electrodes 24 and 25. On the lower electrode 25 is placed a specimen 27. The lower electrode 25 is in thermal communication with a heater 28 for heating the specimen 27 to a desired temperature. The vacuum chamber 22 is in communication with a vacuum pump 29 so that the vacuum chamber 22 is made vacuous. A gas container 30 supplies hydrocarbon gas into the vacuum chamber 22.

For forming an amorphous carbon film, a specimen 27 such as a silicon substrate is placed either on the lower electrode 25 or on the upper electrode 24. The high frequency power applied to the lower electrode 25 ensures that a few hundreds of negative bias voltage is applied to the lower electrode 25. When the specimen 27 is placed on the lower electrode 25 for film deposition, ion accelerated by the bias are irradiated over the specimen 27, and there is obtained an amorphous carbon film which contains less amount of hydrogen therein and has a cross-linked structure in greater degree. On the other hand, when the specimen 27 is placed on the grounded upper electrode 24, ions are not accelerated by the lower electrode 25, and hence there is obtained an amorphous carbon film containing larger amount of hydrogen.

After the specimen 27 has been placed on one of the electrodes 24 and 25, hydrocarbon gas such as $CH_4$, $C_2H_4$, and $C_2H_2$ is introduced into the vacuum chamber 22 from the gas container 30, and then high frequency electric power or dc electric power is applied across the electrodes 24 and 25 at 0.01–0.5 Torr to thereby cause glow discharge. As a result, there is generated hydrocarbon plasma.

The thus generated hydrocarbon plasma makes an amorphous carbon film deposit on the specimen 27. Prior to or during deposition of the amorphous carbon film, the specimen 27 is heated by the heater 28 to a desired temperature in order to control reaction of radicals and ions and hence film quality such as hydrogen content of the amorphous carbon film.

When a fluorinated amorphous carbon film is to be deposited, fluorine family gas such as $CF_4$, $SF_6$, $C_2F_4$, $NF_3$, $C_2F_6$, $C_3F_8$ and $C_4$-$F_8$ is concurrently introduced together with the above mentioned hydrocarbon gas into the vacuum chamber 22 from the gas container 30. Subsequent steps are the same as those for depositing the amorphous carbon film.

Figure 3:
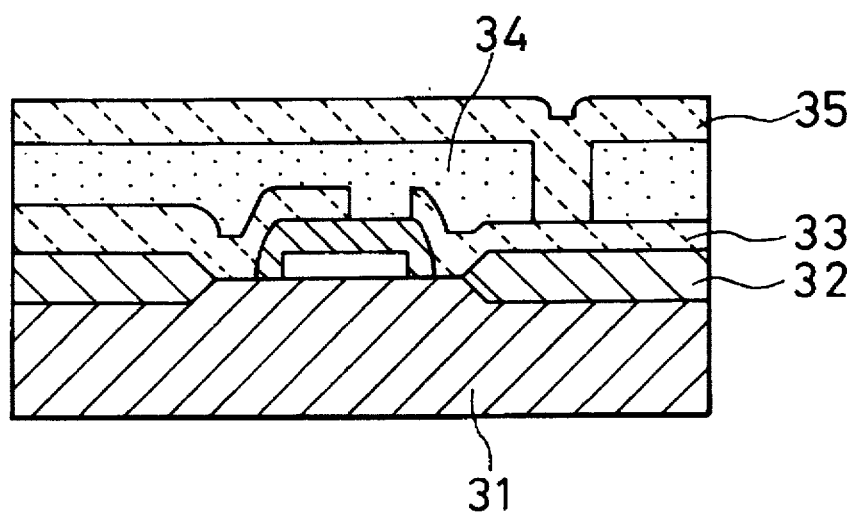
FIG. 3 is a cross-sectional view of a semiconductor device having an interlayer insulative layer composed of the amorphous carbon film.

Hereinbelow will be explained a detailed experimental example. FIG. 3 shows a cross-section of a semiconductor device having an interlayer insulative layer composed of the amorphous carbon film in accordance with the invention.

First, a transistor was fabricated on a silicon substrate 31 in a conventional manner. On the silicon substrate 31 was selectively deposited field $SiO_2$ films 32 to define active regions. After material such as aluminum for formation of an electrode was deposited, wirings were patterned by means of conventional lithography technique to thereby form a first aluminum layer 33. Then, the silicon substrate 31 on which the aluminum wiring 33 had been formed was placed in the vacuum chamber 22 of the apparatus illustrated in FIG. 2.

Into the vacuum chamber 22 was introduced hydrocarbon gas such as $C_4$, $C_2H_4$, and $C_2H_2$, and then high frequency electric power was applied across the electrodes 24 and 25 to make a discharge to thereby develop the hydrocarbon gas into plasmatic condition. In place of the hydrocarbon gas, there may be used solid material such as naphthalene or hydrocarbon in liquid phase. In order to make a discharge, there may be used, in place of the above mentioned high frequency discharge, direct current discharge, microwave discharge, magnetron type discharge, and inductive coupling type discharge in which a coil is used for making a discharge. The thus generated hydrocarbon radical molecules and ions make an amorphous carbon film deposit on the silicon substrate 31. Then, over the amorphous carbon film 34 was patterned a second aluminum layer 35.

When a fluorinated amorphous carbon film is to be deposited, fluorine family gas such as $CF_4$, $SF_6$, $C_2F_4$, $NF_3$ and $C_2F_6$ together with the hydrocarbon gas were introduced into the vacuum chamber 22. Then, there was generated a plasma to thereby deposit a fluorinated amorphous carbon film on the silicon substrate 31.

When only 10 sccm of $CH_4$ gas was introduced into the vacuum chamber 22 and high frequency electric power by 50 W was applied across the electrodes 24 and 25 at 0.1 Torr at high temperature, resultant amorphous carbon film, which was deposited on the lower electrode 25, had a dielectric constant of 2.9. When high frequency electric power by 100 W was applied across the electrodes 24 and 25 under otherwise unchanged conditions, a dielectric constant of the resultant amorphous carbon film was raised to 3.2. It is considered that as high frequency electric power is increased, an amorphous carbon film is crosslinked in greater degree with the result of a higher dielectric constant.

Next will be explained an example of a fluorinated amorphous carbon film. After a specimen was placed on the lower electrode, 5 sccm of $CH_4$ gas and 50 sccm of $CF_4$ gas were introduced into the vacuum chamber 22 of the plasma generator, and high frequency electric power of 100 W was applied across the electrodes. A dielectric constant of the resultant fluorinated amorphous carbon film was decreased down to 2.5.

Figure 4A:
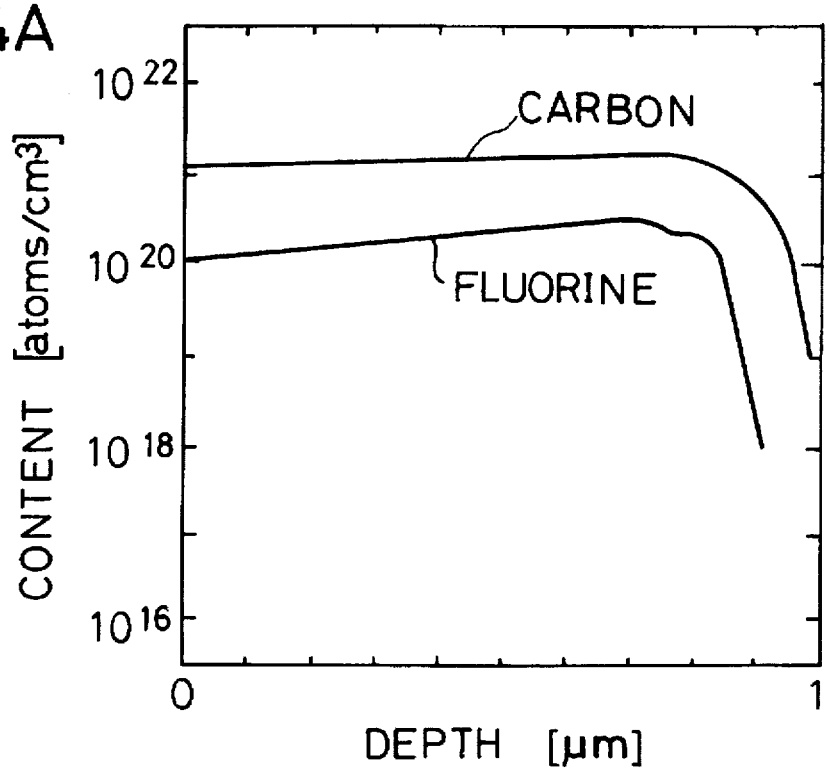
FIGS. 4A and 4B are graphs showing distribution of fluorine content in a depthwise direction of the amorphous carbon film.
Figure 4B:
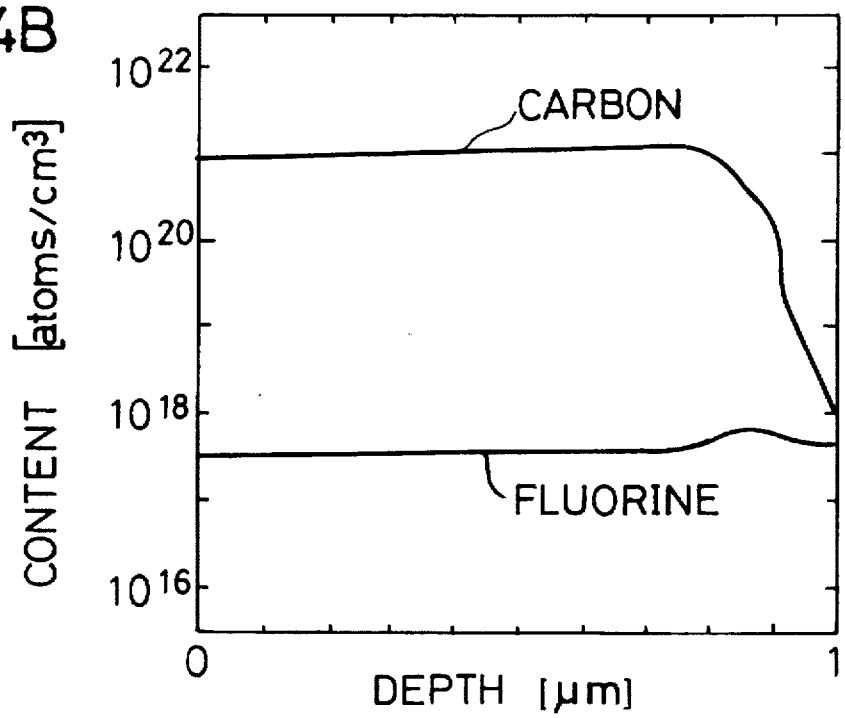
Figure 5:
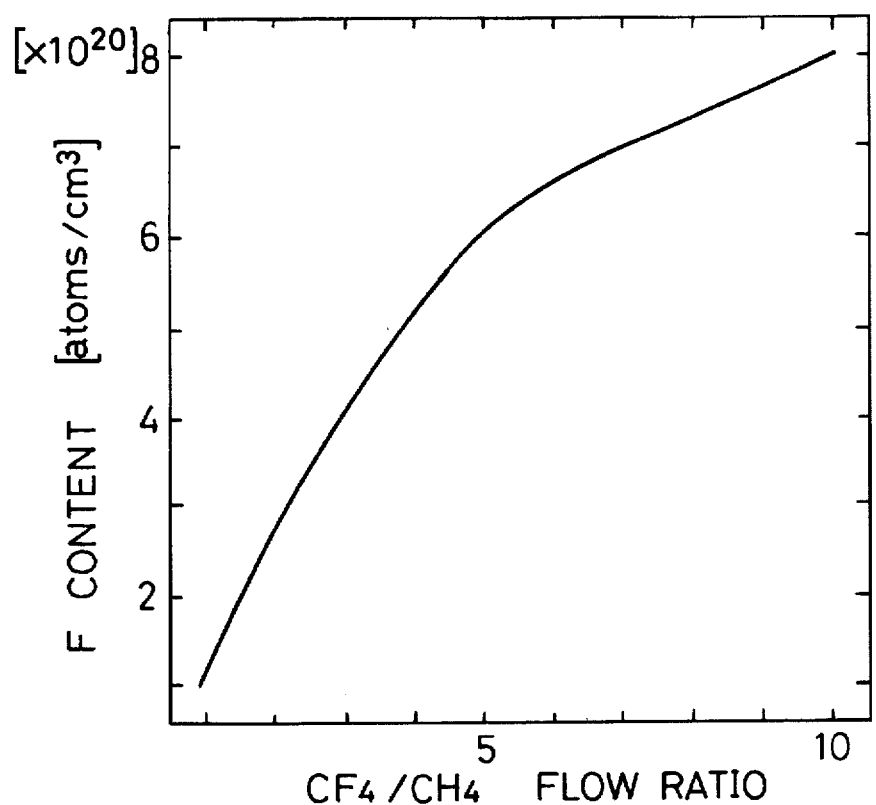
FIG. 5 is a graph showing a relationship between fluorine content of the amorphous carbon film and $CF_4/CH_4$ flow ratio.

FIG. 4A shows fluorine content in a depthwise direction of this fluorinated amorphous carbon film, while FIG. 4B shows fluorine content of an amorphous carbon film which was deposited by introducing 10 sccm of $CH_4$ gas into the vacuum chamber 22, and applying high frequency electric power of 100 W across the electrodes 24 and 25. The fluorine content was measured by secondary ion mass spectrometry. As is obvious, fluorine content of the fluorinated amorphous carbon film (FIG. 4A) is two figures greater than that of the non-fluorinated amorphous carbon film (FIG. 4B). The fluorine content can be controlled by varying flow ratio of fluorine family gas to hydrocarbon gas. FIG. 5 shows a relationship between flow ratio of fluorine family gas to hydrocarbon gas and fluorine content in the film.

However, if a fluorinated amorphous carbon film is deposited directly on silicon or aluminum substrate, there is a fear that the deposited amorphous carbon film may be peeled off the substrate because of fluorine present in an interface between the film and the substrate. In order to avoid peeling off the film, the fluorine content profile is optimized in the invention as follows.

Figure 6:
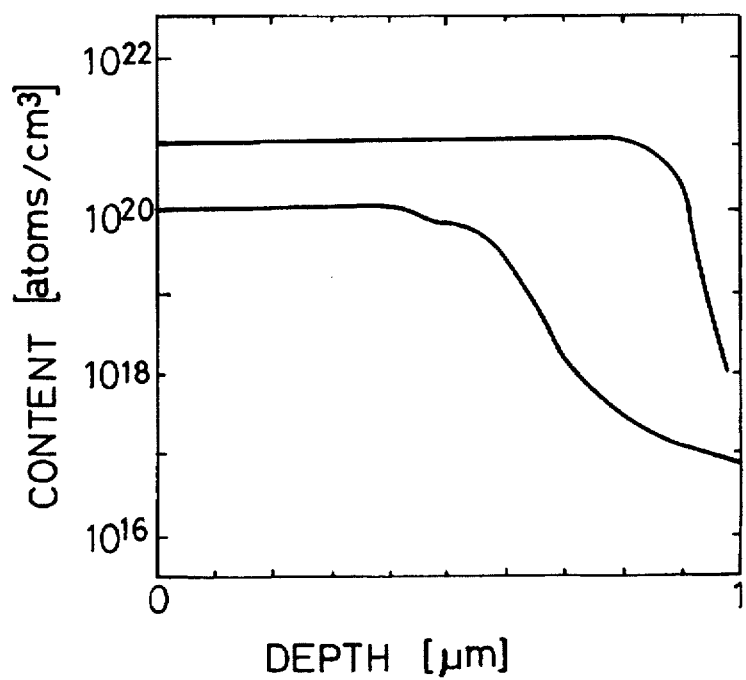
FIG. 6 is a graph showing distribution of fluorine content in a depthwise direction of the fluorinated amorphous carbon film.

FIG. 6 shows fluorine content in a depthwise direction of an amorphous carbon film which was deposited in such a way that fluorine family gas was not introduced into the vacuum chamber at the initial stage of film deposition, and was introduced at the intermediate stage of film deposition. By making fluorine content profile in a depthwise direction of the film, it is possible to enhance cohesion of the film with the substrate because there exists no fluorine in an interface between the amorphous carbon film and the substrate. In accordance with the results of peeling test, a peeling rate of an amorphous carbon film could be improved by about 80% in comparison with a film which was deposited by introducing fluorine family gas from the initial stage of film formation.

In the profile illustrated in FIG. 6, fluorine content gradually decreases from the amorphous carbon film to the interface. However, it should be noted that what is necessary is that no fluorine is present at the interface between the film and the substrate, and hence there may be adopted a steep profile in which fluorine content is sharply decreased to zero at the interface.

Figure 7:
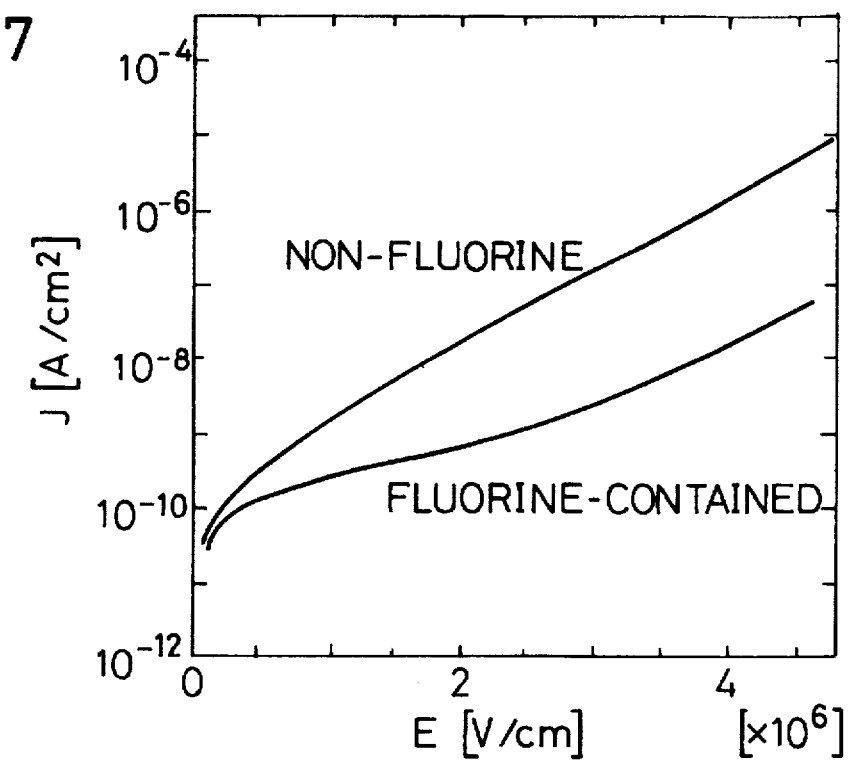
FIG. 7 is a graph showing current-voltage characteristic of the amorphous carbon film and the fluorinated amorphous carbon film.

FIG. 7 shows current-voltage characteristic of the fluorinated amorphous carbon film and a non-fluorinated amorphous carbon film. It is understood that the fluorinated amorphous carbon film has enhanced insulation property relative to the non-fluorinated amorphous carbon film. It is considered that this is because trap level present in an amorphous carbon film is terminated by fluorine, and hence there exists no trap level.

Figure 8:
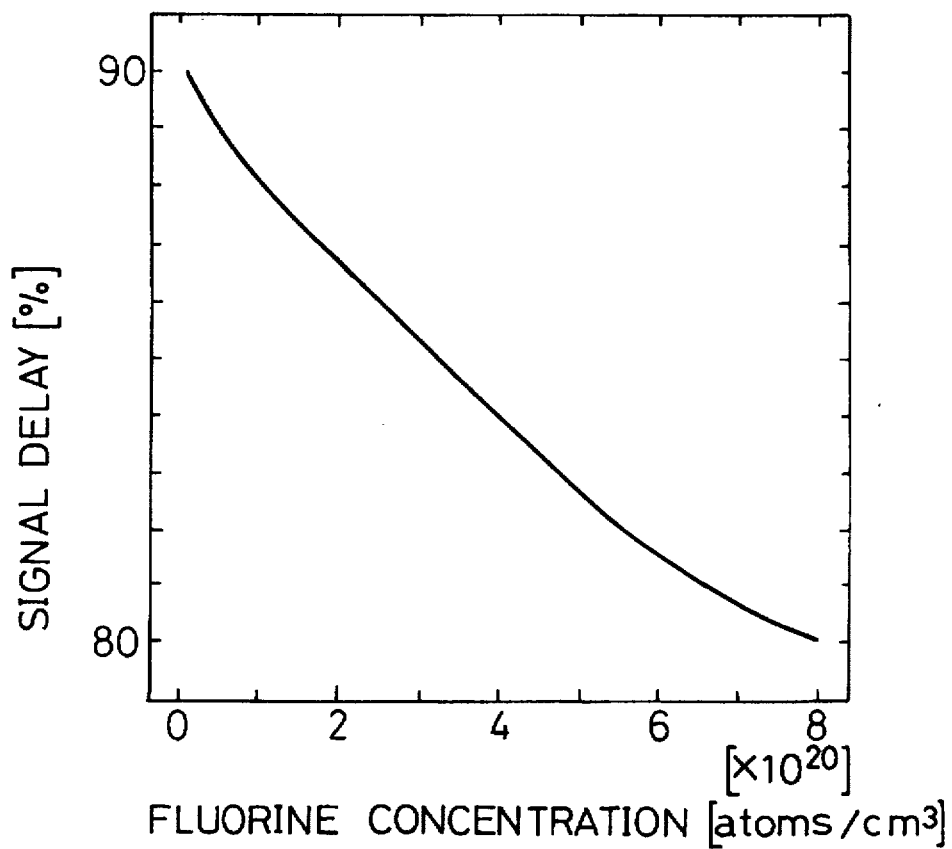
FIG. 8 is a graph showing a relationship between signal delay time and concentration of fluorine molecules in the semiconductor device in accordance with the invention.

FIG. 8 shows a relationship between fluorine content and signal delay time of a semiconductor device having an interlayer insulative layer composed of the amorphous carbon film and the amorphous carbon film containing fluorine therein. The graph in FIG. 8 is normalized so that signal delay measured in a semiconductor device having an interlayer insulative layer composed of $SiO_2$ represents 100%. Even if an interlayer insulative layer is composed of an amorphous carbon film containing no fluorine is used, the interlayer insulative layer can have a smaller dielectric constant than that of an interlayer insulative layer composed of $SiO_2$ with the result of higher operation speed of a semiconductor device. As fluorine content increases, the amorphous carbon film can have a smaller dielectric constant with the result of decreased signal delay time. In particular, by composing an interlayer insulative layer of a fluorinated amorphous carbon film having a dielectric constant of 2.5, signal delay time could be decreased down to 80%.

The inventor has recognized that even if an amorphous carbon film or a fluorinated amorphous carbon film each of which was deposited on the upper electrode is used, higher operation speed of a semiconductor device can be accomplished. In addition, an amorphous carbon film and a fluorinated amorphous carbon film which were deposited using magnetron, helicon wave or microwave could have dielectric constants of 2.9 and 2.5, respectively. Thus, it is also possible to accomplish higher operation speed of a semiconductor device, similarly to the amorphous carbon film deposited using high frequency discharge, by composing an interlayer insulative layer of those films.

Referring back to FIG. 2, hereinbelow will be explained a fluorinated amorphous carbon film containing nitrogen or silicon. First, an embodiment of a fluorinated amorphous carbon film containing nitrogen therein is explained. The fluorinated amorphous carbon film containing nitrogen was deposited using a mixture gas including $CF_4$, $CH_4$ and $N_2$. The deposition was carried out with $SiO_2/Si$ (100) and $P^+$ Si(100) substrates 27 being mounted on the lower electrode 25 to which high frequency electric power is to be applied. The amorphous carbon film was deposited under the condition that the mixture gas flow was kept to be constant at 50 sccm, high frequency electric power was kept to be 200 W, and a $CF_4/CH_4$ flow ratio was also kept to be 16, while $N_2$ gas flow rate was varied.

Figure 9:
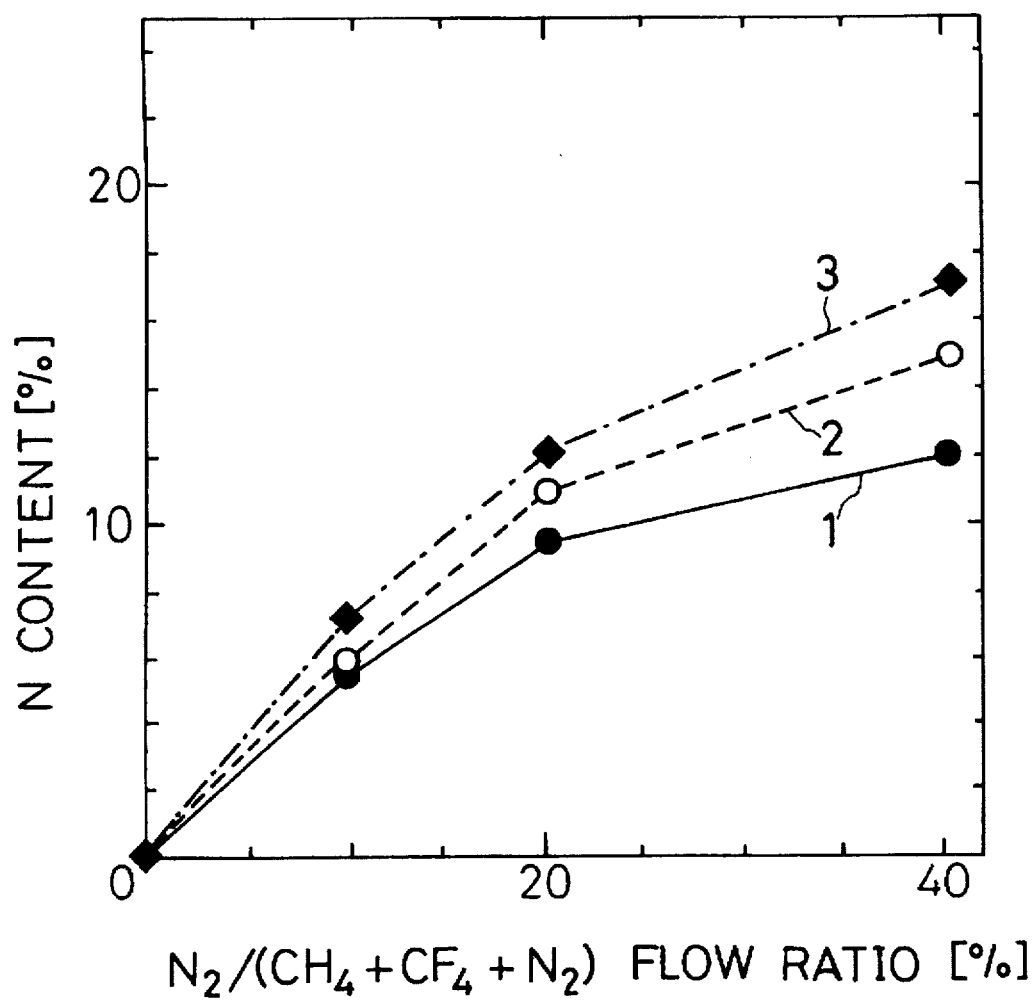
FIG. 9 is a graph, showing a relationship between nitrogen content in the amorphous carbon film and a flow ratio of $N_2$ gas to total gas.

A resultant amorphous carbon film was heated to 500 degrees centigrade in vacuum. The heat resistance of the film was evaluated with decrease in a film thickness. Nitrogen content of the film was measured from a ratio among areas of $C1_s$, $F1_s$ and $N1_s$ peaks of signals obtained by means of X-ray photoelectron spectrophotometry. A dielectric constant of the amorphous carbon film was measured by measuring a capacity (1 MHz) of a capacitor composed of Al/amorphous carbon film/$p^+$ Si. FIG. 9 shows a relationship between a gas flow ratio of $N_2$ gas to all the gas and nitrogen content of the film. It is understood that nitrogen content increases as the/low ratio increases.

Figure 10:
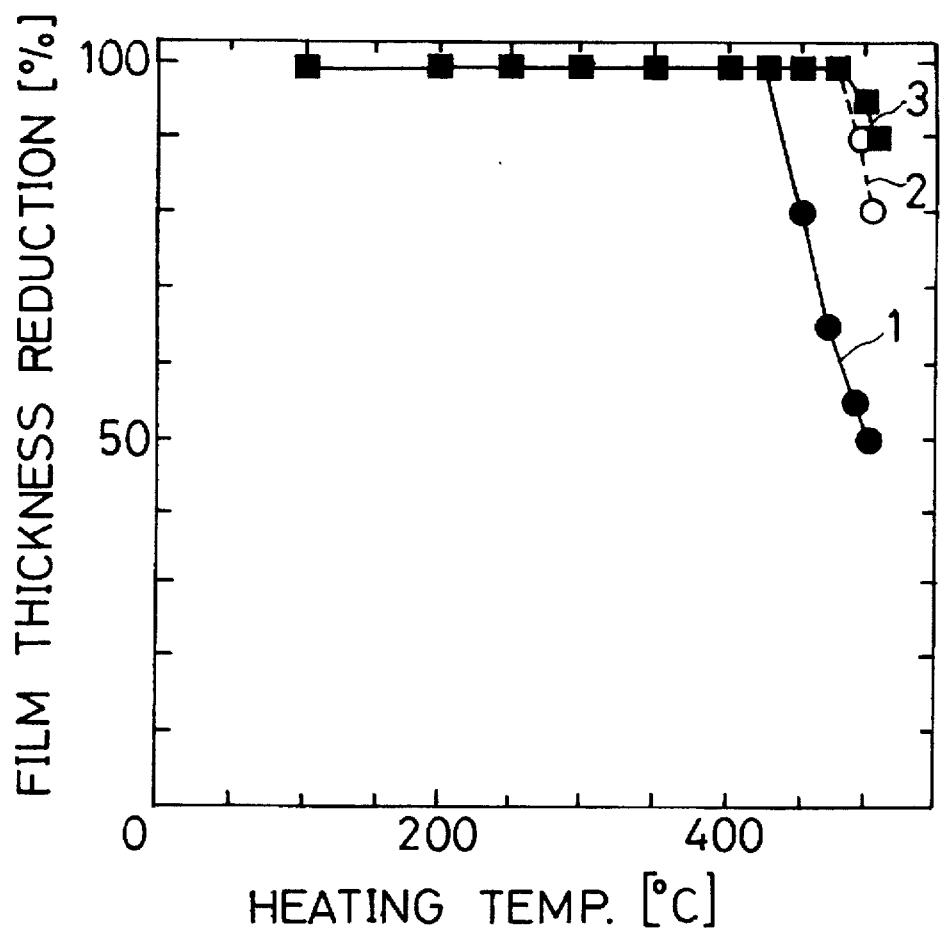
FIG. 10 is a graph showing how heat resistance of the amorphous carbon film varies in dependence on a flow ratio of $N_2$ gas to total gas.

FIG. 10 shows a relationship between heat resistance of the film and the gas flow ratio of $N_2$ gas to all the gas. Herein, the heat resistance is represented by a degree of decrease of a film thickness, namely a ratio of a film thickness measured after heating to a film thickness measured prior to heating. The film was heated for an hour in vacuum at plotted temperatures. As is shown in FIGS. 9 and 10, an amorphous carbon film can contain nitrogen therein by adding $N_2$ gas into a process gas, and the amorphous carbon film containing nitrogen can have enhanced heat resistance relative to an amorphous carbon film containing no nitrogen. In particular, it was found that an amorphous carbon film containing nitrogen by 15% or more can have high heat resistance by which the film thickness is not reduced even if the amorphous carbon film is heated to 470 degrees centigrade.

Figure 11:
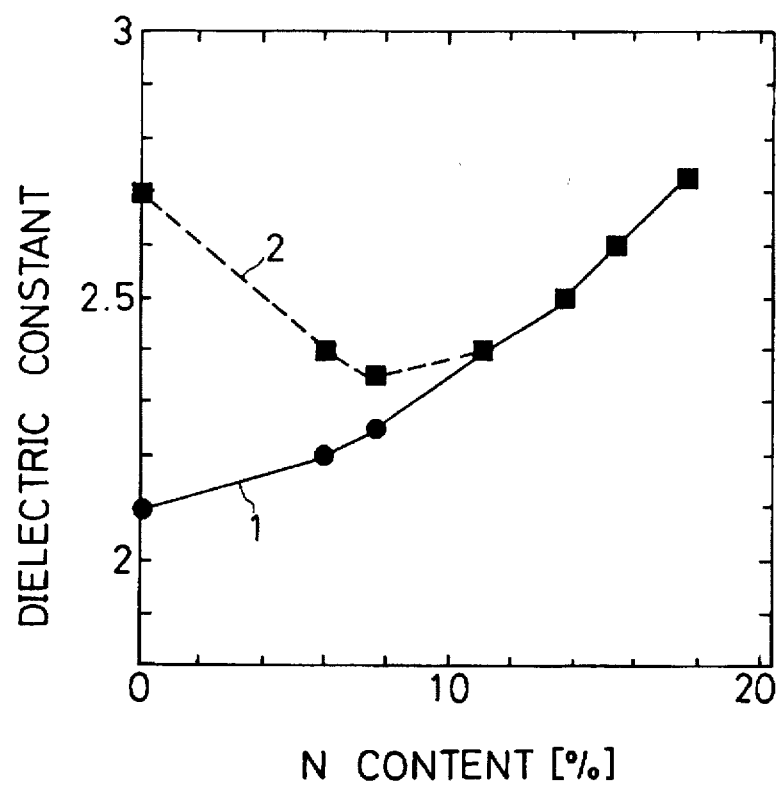
FIG. 11 is a graph showing a relationship between a dielectric constant of the amorphous carbon film and nitrogen content of the film.

FIG. 11 shows a relationship between nitrogen content of the amorphous carbon film and a dielectric constant measured from capacitance of the film. The curve 1 shows a dielectric constant of the film prior to heat treatment thereof. As is shown, as the nitrogen content increases, the dielectric constant simply increases. Thus, it has been found that a dielectric constant of the film increases with the increase of nitrogen content thereof, however, the dielectric constant remains smaller than 3. The curve 2 shows a dielectric constant of an amorphous carbon film which was subject to heat-treatment for an hour at 300 degrees centigrade in vacuum. An amorphous carbon film containing no or only small amount of nitrogen exhibits raise-up of a dielectric constant under heat treatment at 300 degrees centigrade, however, it has been found that addition of nitrogen into an amorphous carbon film can suppress such raise-up of a dielectric constant even under 300 degrees centigrade heat treatment. The reason why decrease of a film thickness and increase of a dielectric constant because of heat treatment do not occur is considered that C-N bonds are newly formed in the amorphous carbon film. The bonding energy of C-N is 175 Kcal/mol, while the bonding energy of C—C is 145 Kcal/mol. Thus, the increased heat resistance of the film is considered to be caused by the fact that C-N bond is more stable than C—C bond.

The inventor observed how nitrogen atoms make a bond with other atoms in the film by using X-ray photoelectron spectrometry and infrared absorption spectrometry. The results show that all of nitrogen atoms in the film exist making C-N bonding, and that N-F bonding do not exist in the film. Namely, nitrogen all makes a bond with a carbon atom in the amorphous carbon film to thereby enhance cross-linking degree of the film.

Hereinbelow will be explained an example of a fluorinated amorphous carbon film containing silicon. The fluorinated amorphous carbon film containing silicon was deposited using $SiH_4$ gas with the high frequency discharge apparatus illustrated in FIG. 2. $SiO_2/Si$ (100) and $P^+$ St(100) substrates 27 were mounted on the lower electrode 25 to which high frequency electric power is to be applied. The amorphous carbon film was deposited under the condition that the gas flow was kept to be constant at 50 sccm, high frequency electric power was kept to be 200 W, and a $CF_4/CH_4$ flow ratio was also kept to be 16, while Si gas flow rate was varied.

Figure 12:
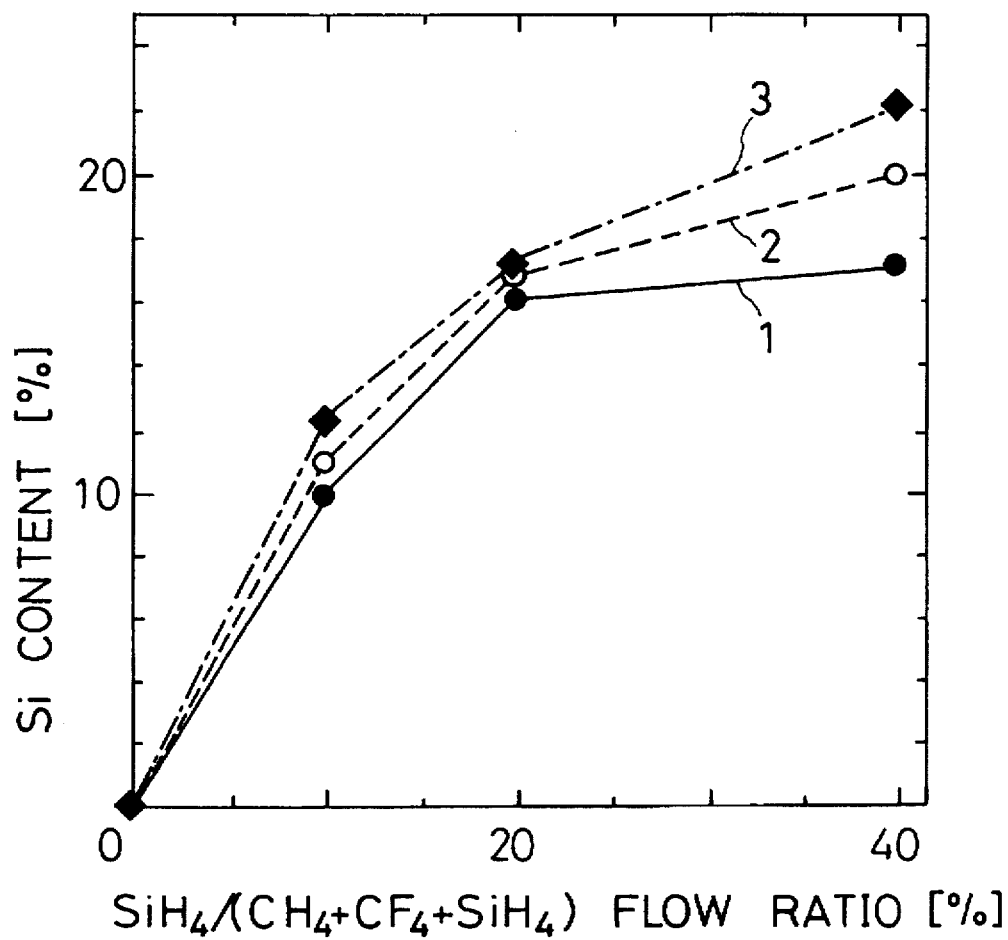
FIG. 12 is a graph showing a relationship between silicon content and a flow ratio of $SiH_4$ to total gas.

A resultant amorphous carbon film was heated to 500 degrees centigrade in vacuum. The heat resistance of the film was evaluated with decrease in a film thickness. Silicon content of the film was measured from a ratio among areas of Cls, Fls and Nls peaks of signals obtained by means of X-ray photoelectron spectrometry. A dielectric constant of the amorphous carbon film was measured by measuring a capacity (1 MHz) of a capacitor composed of Al/amorphous carbon film/$p^+$ Si. FIG. 12 shows a relationship between a gas flow ratio of $SiH_4$ gas to all the gas and silicon content of the film. It is understood that the amorphous carbon film can contain silicon therein only by adding $SiH_4$ gas into the process gas.

Figure 13:
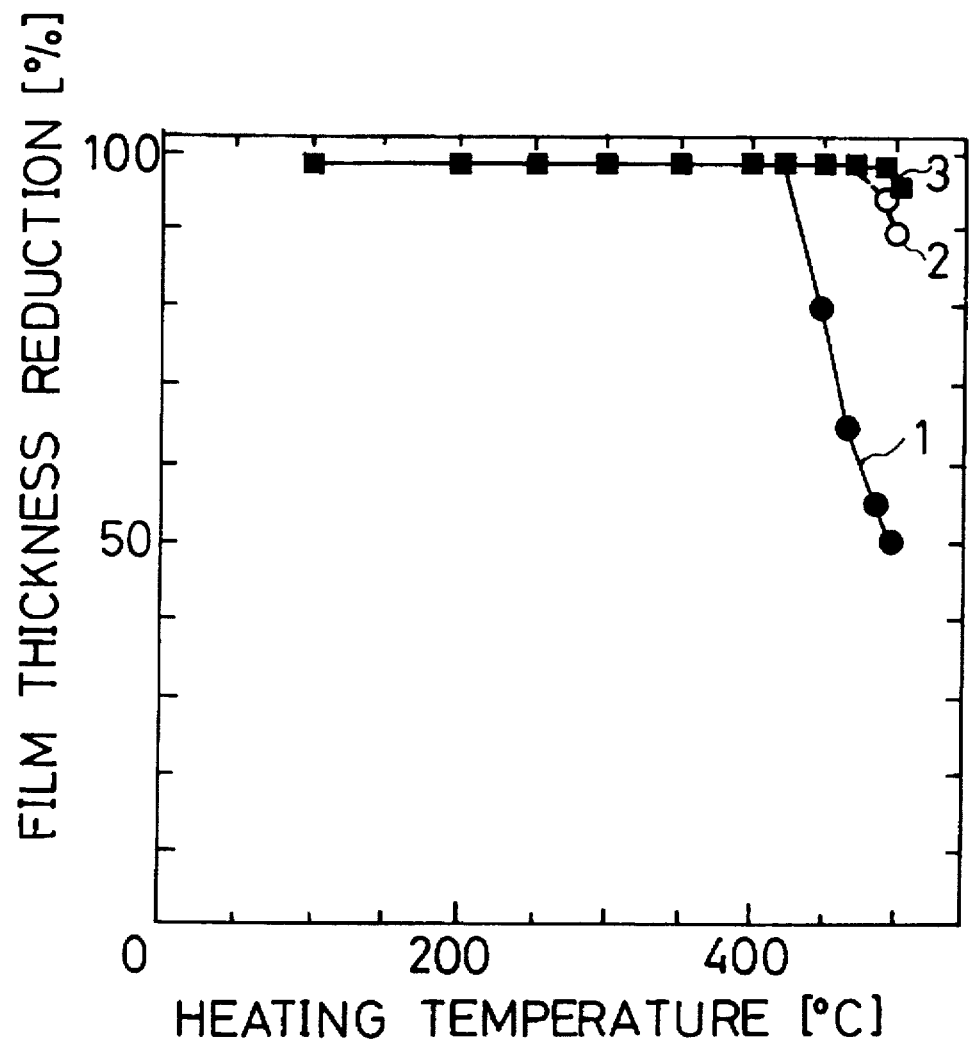
FIG. 13 is a graph showing how heat resistance of the amorphous carbon film varies in dependence on a flow ratio of $SiH_4$ gas to total gas.

FIG. 13 shows heat resistance of the film. Herein, the heat resistance is represented by a degree of decrease of a film thickness, namely a ratio of a film thickness measured after heating to a film thickness measured prior to heating. The film was heated for an hour in vacuum at plotted temperatures. As is shown in FIGS. 12 and 13, an amorphous carbon film can contain silicon therein by adding silicon gas into a process gas, and the amorphous carbon film containing silicon can have enhanced heat resistance relative to an amorphous carbon film containing no silicon. In particular, it was found that the amorphous carbon film containing silicon by 20% or more can have high heat resistance by which the film thickness is not reduced even if the amorphous carbon film is heated to 470 degrees centigrade.

Figure 14:
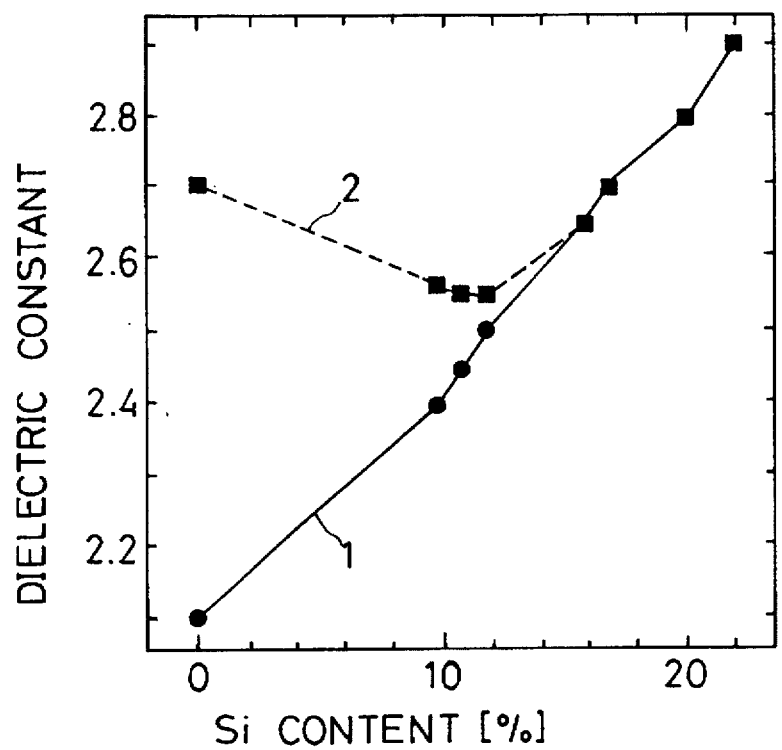
FIG. 14 is a graph showing a relationship between a dielectric constant of the amorphous carbon film and silicon content of the film.

FIG. 14 shows a relationship between silicon content of the amorphous carbon film and a dielectric constant measured from capacitance of the film. The curve 1 shows a dielectric constant of the film measured prior to heat treatment thereof. As is shown, as the silicon content increases, the dielectric constant simply increases. Thus, it has been found that a dielectric constant of the film increases with the increase of silicon content thereof, similarly to the amorphous carbon film containing nitrogen, however, the dielectric constant remains smaller than 3. For instance, the amorphous carbon film containing silicon therein by 20% has a dielectric constant of 2.8. The curve 2 shows a dielectric constant of an amorphous carbon film which was subject to heat-treatment for an hour at 300 degrees centigrade in vacuum. An amorphous carbon film containing small amount of silicon exhibits raise-up of a dielectric constant by heat treatment to be carried out after film deposition. However, it has been found that addition of silicon into an amorphous carbon film can suppress such raise-up of a dielectric constant caused by heat treatment.

The inventor observed how silicon atoms make a bond with other atoms in the film by using X-ray photoelectron spectrometry and infrared absorption spectrometry. The results show that all of silicon atoms in the film exist making Si-C bonding. Thus, it is considered that silicon atoms added into the film make a strong bond with a carbon atom, namely Si-C bonding, to thereby enhance heat resistance of the film.

Figure 15:
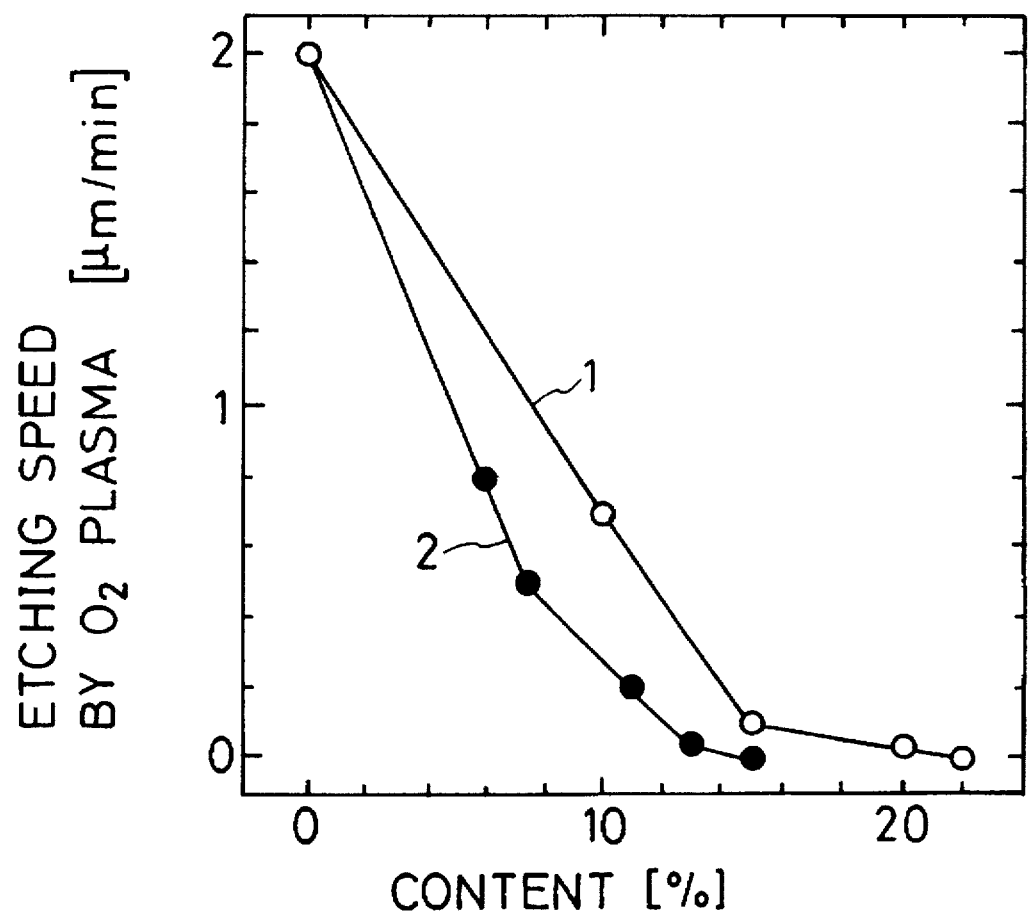
FIG. 15 is a graph showing etching speed of the amorphous carbon film deposited under $O_2$ plasma.

Etching property of the film was also observed. Into the vacuum chamber 22 of the apparatus illustrated in FIG. 2 was supplied 100 sccm of $O_2$ gas, and then an amorphous carbon film was deposited under 200 W of high frequency electric power. Then, a resultant amorphous carbon film was etched, and resistance of the film against oxygen plasma was observed. FIG. 15 shows a relationship between etching speed of fluorinated amorphous carbon film containing nitrogen or silicon when etched by oxygen plasma, and nitrogen or silicon content of the film. By adding nitrogen or silicon into the fluorinated amorphous carbon film, there was obtained an amorphous carbon film having resistance against oxygen plasma.

Figure 16:
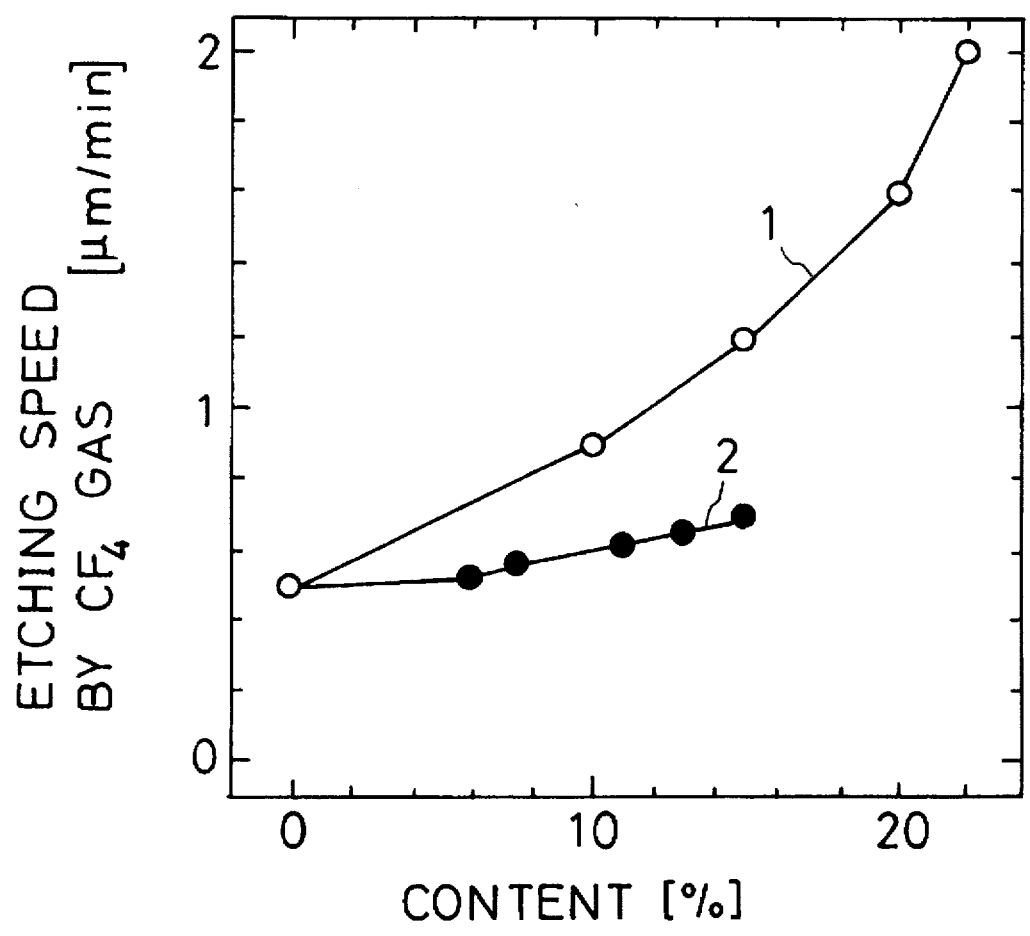
FIG. 16 is a graph showing etching speed of the amorphous carbon film deposited under $CF_4$ plasma.

Next, etching property when etched with $CF_4$ gas was observed. Into the vacuum chamber 22 of the apparatus illustrated in FIG. 2 was supplied 100 sccm of $CF_4$ gas, and an amorphous carbon film was deposited under 200 W of high frequency electric power. Then, a resultant amorphous carbon film was etched. FIG. 16 shows etching speed caused by $CF_4$ plasma. With the use of $CF_4$ gas, etching speed of the fluorinated amorphous carbon film containing silicon therein was increased relative to an amorphous carbon film containing no silicon. The reason of this is considered as follows. A silicon atom is easier to be etched than a carbon atom in carbon fluoride plasma. Hence, silicon atoms in an amorphous carbon film are first etched, and fluorine serving as an etcher is absorbed in a hole where a silicon atom used to exist. Thus, etching of the film is developed.

Hereinbelow are explained embodiments in which gases other than $N_2$ and $SiH_4$ used in the above mentioned embodiments are used to deposit a fluorinated amorphous carbon film containing nitrogen and silicon. An amorphous carbon film containing nitrogen was deposited using $CF_4$ gas or a mixture gas of $CF_4$ and $CH_4$ to which NO, $NO_2$, $NH_3$ or $NF_3$ gas was added as nitrogen source. The thus formed amorphous carbon film containing nitrogen has the same heat resistance and etching property as the amorphous carbon film deposited using $N_2$ gas.

Various process gases may be used to deposit an amorphous carbon film containing nitrogen or silicon. For instance, amorphous carbon films were deposited using $C_2F_6$, $C_3F_8$, $C_4F_3$ or $CHF_3$ gas in place of $CF_4$, to which gas $H_2$, $C_2H_6$, $C_2H_4$, $C_2H_2$ or $C_3H_8$ was added as hydrogen source, and to each of which $N_2$, NO, $NO_2$, $NH_3$ or $NF_3$ was further added as nitrogen source. Each of the thus deposited amorphous carbon films exhibits the same heat resistance and etching property.

As to an amorphous carbon film containing silicon therein, an amorphous carbon film was deposited using $CF_4$ gas or a mixture gas of $CF_4$ and $CH_4$ to which $Si_2H_6$ or $SiF_4$ gas was added as silicon source. The thus formed amorphous carbon film containing silicon has the same heat resistance and etching property as the amorphous carbon film deposited using $SiH_4$ gas. There may be used gases other than $CF_4$ and $CH_4$ as process gases. For instance, amorphous carbon films were deposited using $C_2F_6$, $C_3F_8$, $C_4F_8$ or $CHF_3$ gas in place of $CF_4$, to which gas $H_2$, $C_2H_6$, $C_2H_4$, $C_2H_2$ or $C_3H_8$ was added as hydrogen source, and to each of which $SiH_4$, $Si_2H_6$ or $SiF_4$ was further added as silicon source. Each of the thus deposited amorphous carbon films exhibits the same heat resistance and etching property. Since the method for depositing the amorphous carbon film uses plasma, any gas may be used if it contains nitrogen or silicon. In addition, there may be used highly densified plasma caused by microwave discharge or helicon wave discharge. Either of them can provide the same advantageous effects as those obtained by high frequency discharge.

There was fabricated a MOSFET semiconductor device having a structure as illustrated in FIG. 3 in which the interlayer insulative material 34 is composed of the fluorinated amorphous carbon film containing nitrogen or silicon. A semiconductor device having an interlayer insulative layer composed of an amorphous carbon film can have heat resistance against 420 degrees centigrade at maxima due to gas generation out of the amorphous carbon film. On the other hand, the amorphous carbon film including an interlayer insulative layer composed of the fluorinated amorphous carbon film containing nitrogen or silicon can withstand heat treatment at 470 degrees centigrade with the result that contact resistance in wirings is reduced. Thus, signal transmission speed in wirings can be made higher by about 5% relative to that of a semiconductor device having an interlayer insulative layer composed of an amorphous carbon film containing no nitrogen and silicon. In addition, since the same gas and resist as those to be used in conventional $SiO_2$ etching can be used in etching for patterning, and further since resist removal can be carried out by conventional oxygen plasma, a semiconductor device having an interlayer insulative layer composed of the amorphous carbon film containing nitrogen and silicon can be fabricated through the same patterning steps as those to be used for fabricating a semiconductor device including an interlayer insulative layer composed of $SiO_2$. The amorphous carbon film containing nitrogen or silicon can be applied to a semiconductor device Constructed of a bipolar transistor as well as a semiconductor device constructed of MOSFET illustrated in FIG. 3.

Figure 17A:
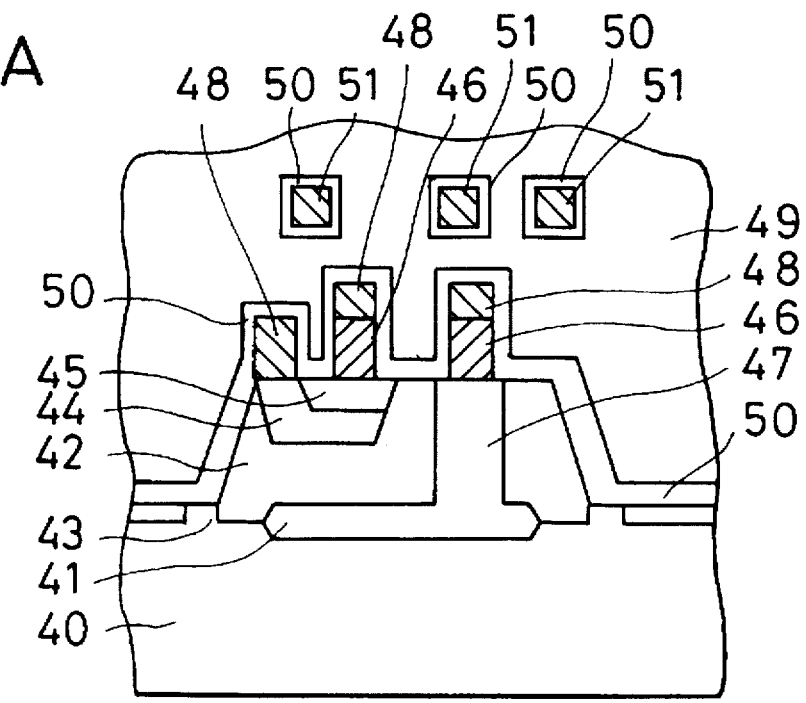
FIG. 17A is a cross-sectional view of a semiconductor device constructed of a bipolar transistor having an interlayer insulative layer composed of the amorphous carbon film and the buffer layer interposed between the interlayer insulative layer and other components.

Hereinbelow will be described embodiments of a semiconductor device including a buffer layer in accordance with the invention. FIG. 17A illustrates a semiconductor device constructed of an npn type bipolar transistor in accordance with an embodiment of the present invention.

The bipolar transistor comprises a p type semiconductor substrate 40 on which an $n^+$ diffusion layer 41 is formed.

Over the n⁺ diffusion layer 41 is formed an epitaxial n type layer 42, and beside the n type layer 42 is formed a p⁺ isolation layer 43 by ion implantation. On the epitaxial n type layer 42 is formed a p type layer 44 by ion implantation. The p type layer 44 serves as a base. Between the epitaxial n type layer 42 and the p type layer 44 is formed an n⁺ emitter layer 45. On the epitaxial n type layer 42 is formed an n⁺ type polysilicon electrode 46 which is connected with the n⁺ type diffusion layer 41 through an n⁺ type layer 47. On the n⁺ type emitter layer 45 is also formed the n⁺ type polysilicon electrode 46. On the p type layer 44 and the n⁺ type polysilicon electrodes 46 are formed metal electrodes 48 serving as a gate.

In the semiconductor device illustrated in FIG. 17A, an amorphous carbon film 49 is arranged not to come to direct contact with active regions of a transistor and wirings. Namely, a buffer layer 50 composed of $SiO_2$ is formed between the amorphous carbon film 49 and the active regions and wirings. The buffer layer 12 is deposited as follows.

After defining active regions of a transistor, polysilicon and metal are deposited over the substrate. Then, the deposited polysilicon and metal are patterned in a conventional manner. Then, a thin $SiO_2$ layer is deposited over a transistor region by plasma-enhanced chemical vapor deposition (PCVD). In this embodiment, a thin $SiO_2$ layer having a thickness of 0.01 μm is used as the buffer layer 50. Then, over the buffer layer 50 composed of a thin $SiO_2$ layer is deposited the amorphous carbon film 49 by about 1 μm thickness as an interlayer insulative layer. Further, over the amorphous carbon film 49 are deposited aluminum wirings 51. The aluminum wirings 51 are also covered with the thin $SiO_2$ buffer layer 50 so that the aluminum wirings 51 do not come to direct contact with the amorphous carbon film 49.

The reason why the $SiO_2$ buffer layer 50 has a thickness of 0.01 μm is based on the discovery that if the $SiO_2$ buffer layer 50 has a thickness smaller than 0.01 μm, the $SiO_2$ layer does not work as a buffer layer against gas discharged out of the amorphous carbon film 49 when the film 49 is under heat treatment at 500 degrees centigrade. On the other hand, if the buffer layer 50 has a thickness greater than 0.01 μm, a total dielectric constant of the amorphous carbon film 49 is increased. For this reason, the buffer layer 50 is preferably as thin is possible.

Accordingly, a thickness of the buffer layer 50 is determined by a temperature of heat treatment to be carried out in semiconductor device fabrication process. If a semiconductor device is allowed to have low heat resistance, the buffer layer 50 may have a thickness smaller than 0.01 μm. Even if the buffer layer 50 has such a thickness, the buffer layer 50 serves as a buffer layer against gas discharged out of the amorphous carbon film. On the other hand, if a semiconductor device is required to have high heat resistance, it is necessary for the buffer layer 50 to have a thickness greater than 0.01 μm. In this embodiment, the $SiO_2$ layer having a dielectric constant of 4 is deposited by 0.01 μm, while the amorphous carbon film 49 having a dielectric constant of 2.3 is deposited by 1 μm. A dielectric constant of the $SiO_2$ layer and the amorphous carbon film 49 as a whole is 2.3 provided that a capacitor is in connection with each of the layer and film in series. Namely, the increase of a dielectric constant caused by the $SiO_2$ layer can be disregarded.

Figure 17B:
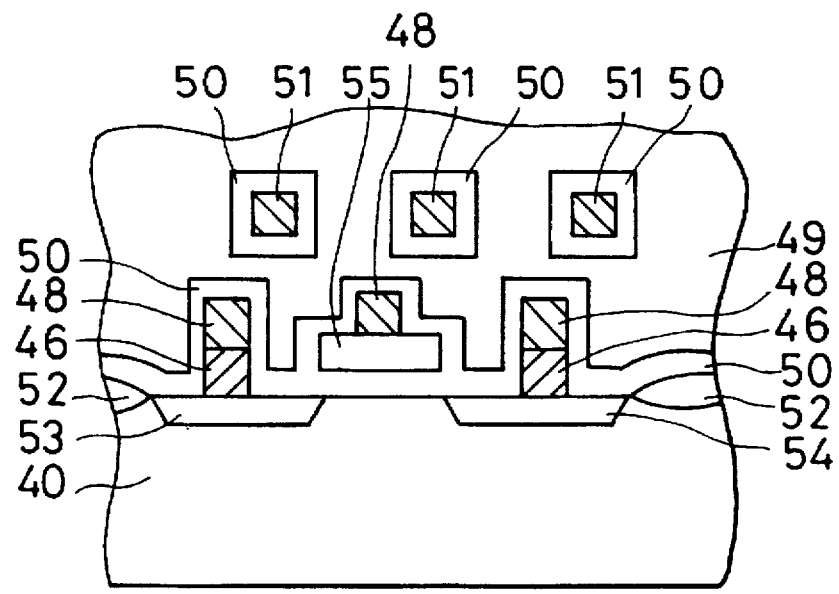
FIG. 17B is a cross-sectional view of a semiconductor device constructed of MOSFET having an interlayer insulative layer composed of the amorphous carbon film and the buffer layer interposed between the interlayer insulative layer and other components.

Hereinbelow is explained a second embodiment with reference to FIG. 17B. In this embodiment, a semiconductor device is constructed of n channel type MOSFET. The semiconductor device has a p type semiconductor substrate 40 on which field $SiO_2$ films 52 are formed except areas which would be used as active regions of a semiconductor device. In the active regions are formed a source 53 and a drain 54 by ion implantation. Centrally between the source 53 and the drain 54 is formed a gate electrode 55 on a thin $SiO_2$ film (not illustrated), which gate electrode 55 is composed of polysilicon. Over these contacts is deposited the buffer layer 50 composed of a thin $SiO_2$ layer, and over the thin $SiO_2$ buffer layer 50 is deposited the amorphous carbon film 49. In this embodiment, the $SiO_2$ buffer layer 50 has a thickness of 0.01 μm, similarly to the previously mentioned embodiment.

Many variations of the $SiO_2$ buffer layer 50 are deposited for comparison with the buffer layer 50 as follow.

Variation 1: An $Si_3N_4$ buffer layer is deposited by 0.01 μm thickness in place of the $SiO_2$ layer in the first embodiment (FIG. 17A).

Variation 2: An amorphous carbon film containing silicon by 40% is deposited as a buffer layer in place of the $SiO_2$ layer in the first embodiment.

Variation 3: An amorphous carbon film containing nitrogen by 40% is deposited as a buffer layer in place of the $SiO_2$ layer in the first embodiment.

Variation 4: An $Si_3N_4$ buffer layer is deposited by 0.01 μm thickness in place of the $SiO_2$ layer in the second embodiment (FIG. 17B).

Variation 5: An amorphous carbon film containing silicon by 40% is deposited as a buffer layer in place of the $SiO_2$ layer in the second embodiment.

Variation 6: An amorphous carbon film containing nitrogen by 40% is deposited as a buffer layer in place of the $SiO_2$ layer in the second embodiment.

These variations were heated up to 600 degrees centigrade for failure test of wirings. The results are shown in the following table. The temperature listed in the table indicates a temperature at which there occurs defectiveness such as irregularity caused by that gas broken out of the amorphous carbon film due to decomposition of the film blows off to the wirings.

Figure 1A:
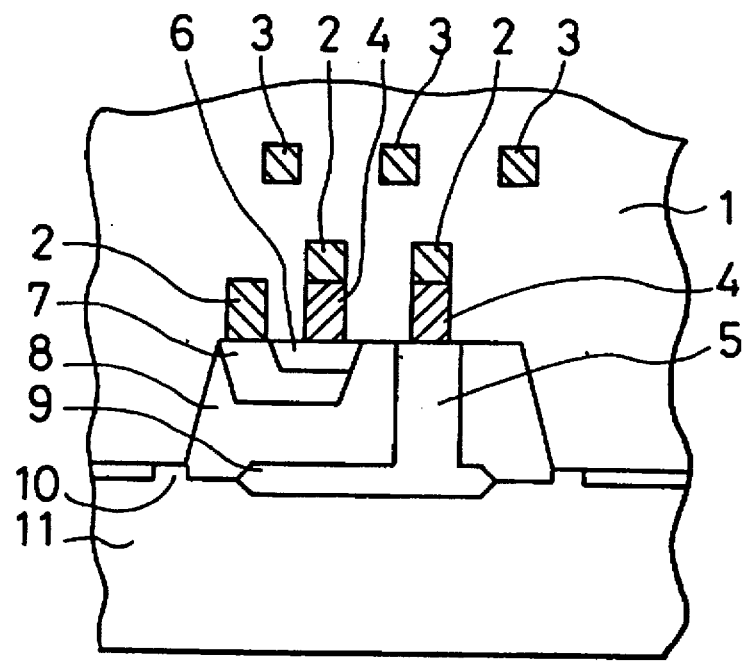
FIG. 1A is a cross-sectional view of a semiconductor device constructed of a bipolar transistor having an interlayer insulative layer composed of the amorphous carbon film.
Figure 1B:
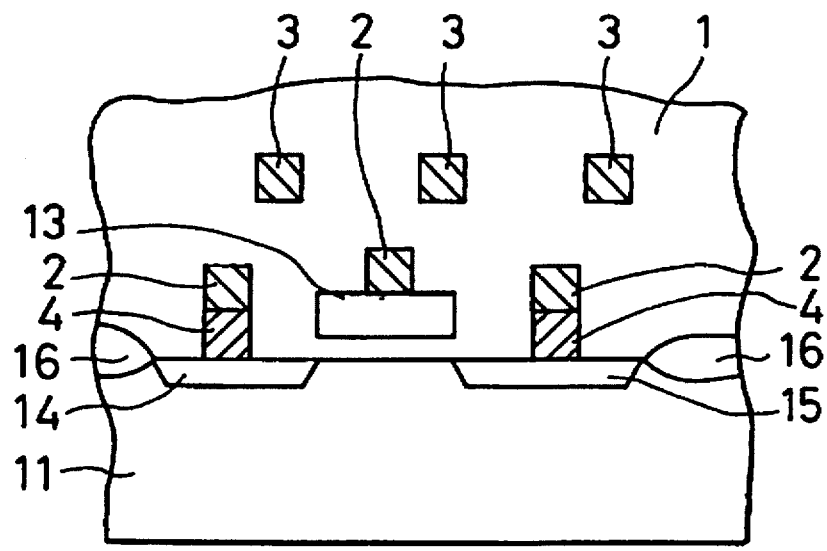
FIG. 1B is a cross-sectional view of a semiconductor device constructed of MOSFET having an interlayer insulative layer composed of the amorphous carbon film.

| Semiconductor Devices in FIGS. 1A and 1B | 420° C. |
| --- | --- |
| First Embodiment (FIG. 17A) | 500° C. |
| Second Embodiment (FIG. 17B) | 500° C. |
| Variation 1 | 520° C. |
| Variation 2 | 470° C. |
| Variation 3 | 470° C. |
| Variation 4 | 520° C. |
| Variation 5 | 470° C. |
| Variation 6 | 470° C. |

It has been found in a prior semiconductor device that a threshold voltage of MOSFET was varied by heat treatment at 500 degrees centigrade. However, it is possible in the second embodiment (FIG. 17B), in which a transistor section is covered with the $SiO_2$ buffer layer, to prevent a threshold voltage from varying due to heat treatment thereof at 500 degrees centigrade. The reason why the threshold voltage is varied in prior semiconductor device is considered that impurities derived from gas broken out of the amorphous carbon film while heat treatment enter a gate oxide layer of a transistor.

Figure 18A:
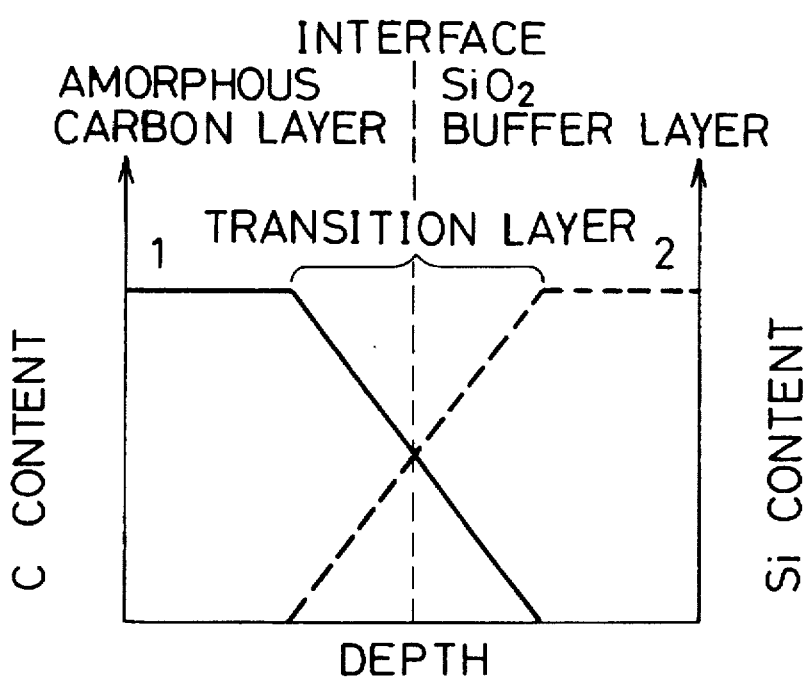
FIG. 18A shows a structure of a semiconductor device having the transition layer between the amorphous carbon film and the buffer layer.
Figure 18B:
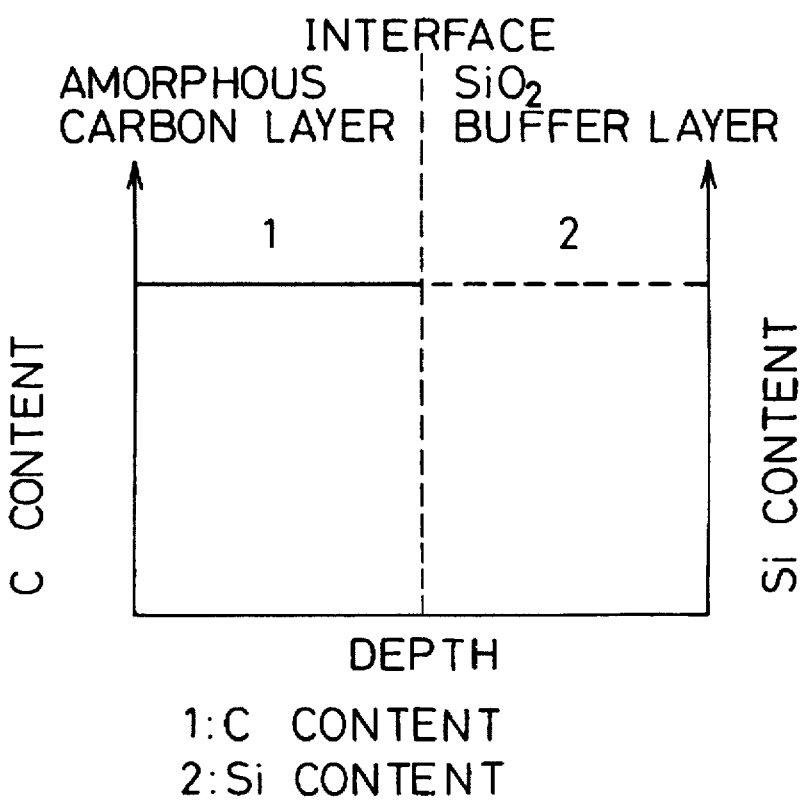
FIG. 18B shows a structure of a semiconductor device having no transition layer.

In the first embodiment illustrated in FIG. 17A, as illustrated in FIG. 18B, the structure suddenly changes from the amorphous carbon film to the $SiO_2$ layer at the interface of the amorphous carbon film and the $SiO_2$ layer. In an embodiment described hereinbelow, the structure thereof is not suddenly changed at the interface, but gradually changed from the amorphous carbon film to the $SiO_2$ layer, as illustrated in FIG. 18A. This embodiment has a transition layer having a thickness of about 50 angstroms, in which transition layer carbon and fluorine contents are gradually decreased, while silicon and oxygen contents are gradually increased. Thus, the transition layer is composed of the amorphous carbon film at one end, but composed of the $SiO_2$ layer at opposite end. Over the transition layer is deposited $SiO_2$ by 50 angstroms to thereby construct the buffer layer of a combination of the transition layer and the $SiO_2$ layer.

A semiconductor device in accordance with this embodiment was tested with respect to heat resistance. The same heat resistance could be obtained as that of the first embodiment (FIG. 17A) in which the structure is suddenly changed across the interface. The inventor incorporated the 50 μm thick transition layer into semiconductor devices in accordance with the second embodiment and the variations 1 to 6, and tested them with respect to heat resistance. The same heat resistance could be obtained as that of the first embodiment in which the structure is suddenly changed across the interface.

The buffer layers used in the above mentioned embodiments and variations have different etching rates from those of the amorphous carbon film, fluorinated amorphous carbon film and resist material in $CF_4$ or oxygen plasma etching. Thus, the buffer layers can work as an etching stopper layer in an amorphous carbon film etching step which is indispensable for fabricating a semiconductor device in accordance with the invention, or in resist ashing step which is to be carried out after etching the amorphous carbon film with resist.

Figure 19:
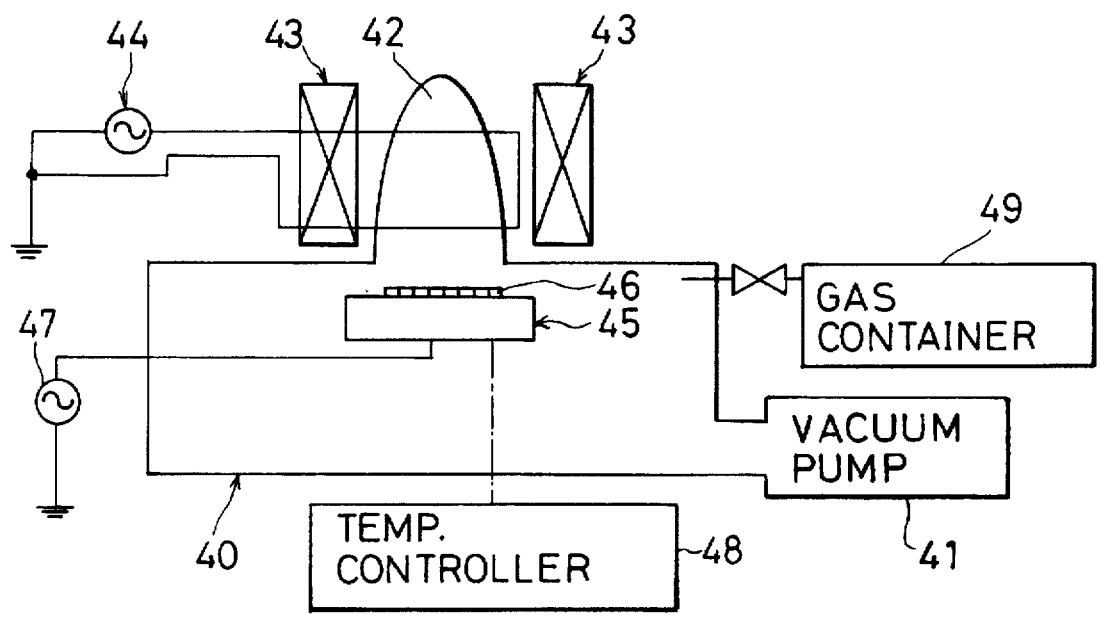
FIG. 19 is a schematic view of an apparatus for depositing a fluorinated amorphous carbon film through the use of helicon wave plasma.

FIG. 19 illustrates an apparatus for carrying out the method in accordance with the invention. The illustrated apparatuses is provided with helicon wave plasma source. The apparatus has a vacuum chamber 40 which is in communication with and is to be made vacuous by a vacuum pump 41. A part of the vacuum chamber 40 defines a plasma chamber 42 surrounded with a plurality of magnets 43. A voltage supply 44 provides high frequency electric power with plasma source in the plasma chamber 42. Within the vacuum chamber 40 is disposed a support plate 45 on which a specimen 46 such as a semiconductor substrate is placed just below the plasma chamber 42. It should be noted that the specimen 46 is not disposed in the plasma chamber 42, but disposed outside the plasma chamber 42. A voltage supply 47 is in communication with the support plate 45, and thus supplies high frequency voltage with the support plate 45. As a result, a bias voltage can be applied to the specimen 46 through the support plate 45 from the voltage supply 47. The support plate 45 is also in communication with a temperature controller 48, and thus is able to be heated or cooled to a desired temperature. A gas container 49 is in fluid communication with the vacuum chamber 40, and thus, supplies carbon fluoride gas such as $CF_4$, $C_2F_6$, $C_3F_8$ and $C_4F_8$ into the vacuum chamber 40.

In operation, the specimen 46 such as a silicon substrate is placed on the support plate 45, and then carbon fluoride gas is introduced into the vacuum chamber 40 from the gas container 49. Then, the voltage supply 44 applies high frequency voltage for discharge to the plasma source at $10^{-3}$ Torr to thereby generate carbon fluoride plasma. An amorphous carbon film is deposited on the specimen 46 by the thus generated carbon fluoride plasma.

Figure 20:
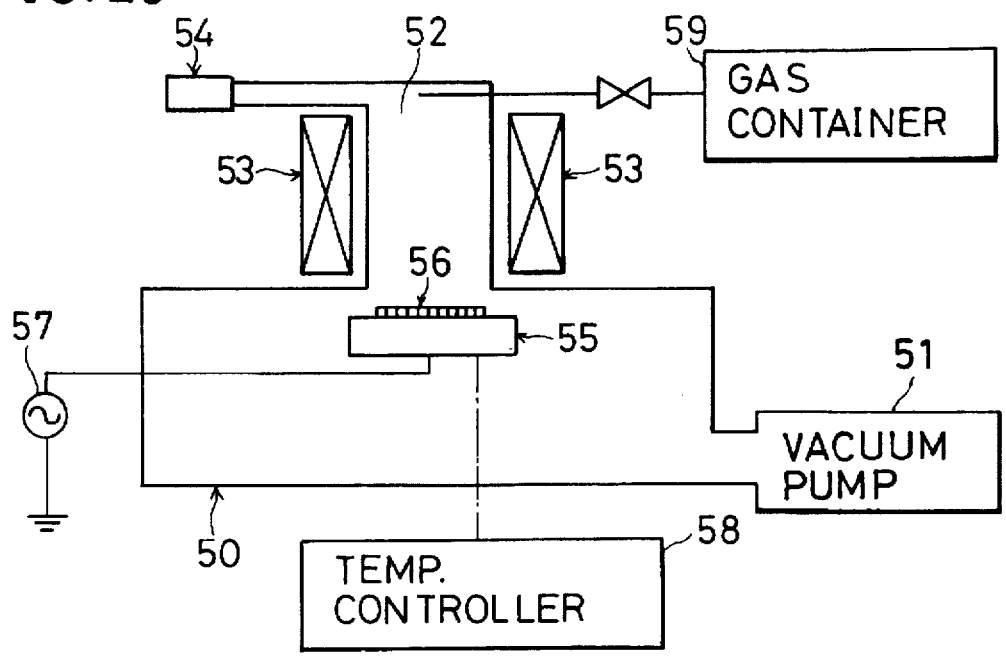
FIG. 20 is a schematic view of an apparatus for depositing a fluorinated amorphous carbon film through the use of microwave plasma.

FIG. 20 illustrates another apparatus for carrying out the method in accordance with the invention. The illustrated apparatuses is provided with microwave plasma source. The apparatus has a vacuum chamber 50 which is in communication with and is to be made vacuous by a vacuum pump 51. A part of the vacuum chamber 50 defines a plasma chamber 52 surrounded with a plurality of magnets 53. A voltage supply 54 provides microwave electric power with plasma source in the plasma chamber 52. Within the vacuum chamber 50 is disposed a support plate 55 on which a specimen 56 such as a semiconductor substrate is placed just below the plasma chamber 52. It should be noted that the specimen 56 is not disposed in the plasma chamber 52, but disposed outside the plasma chamber 52. A voltage supply 57 is in communication with the support plate 55, and thus supplies high frequency voltage with the support plate 55. As a result, a bias voltage can be applied to the specimen 56 through the support plate 55 from the voltage supply 57. The support plate 55 is also in communication with a temperature controller 58, and thus is able to be heated or cooled to a desired temperature. A gas container 59 is in fluid communication with the vacuum chamber 50, and thus supplies carbon fluoride gas such as $CF_4$, $C_2F_6$, $C_3F_8$ and $C_4F_8$ into the vacuum chamber 50.

The apparatus operates in the same way as the apparatus illustrated in FIG. 19.

Figure 21:
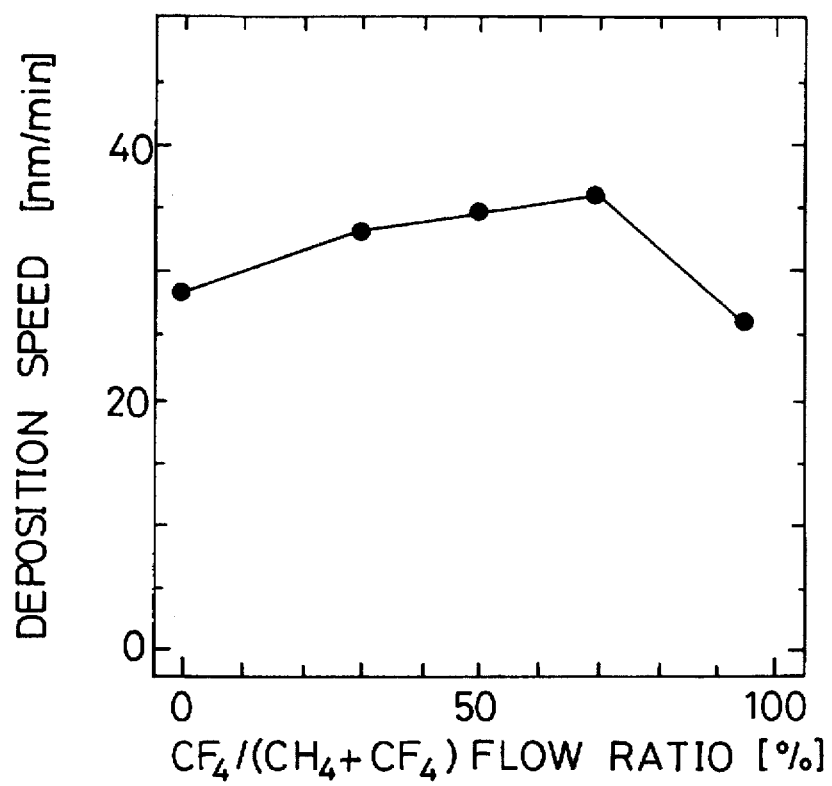
FIG. 21 is a graph showing deposition speed of a fluorinated amorphous carbon film deposited by using a parallel flat plate type plasma source.
Figure 22:
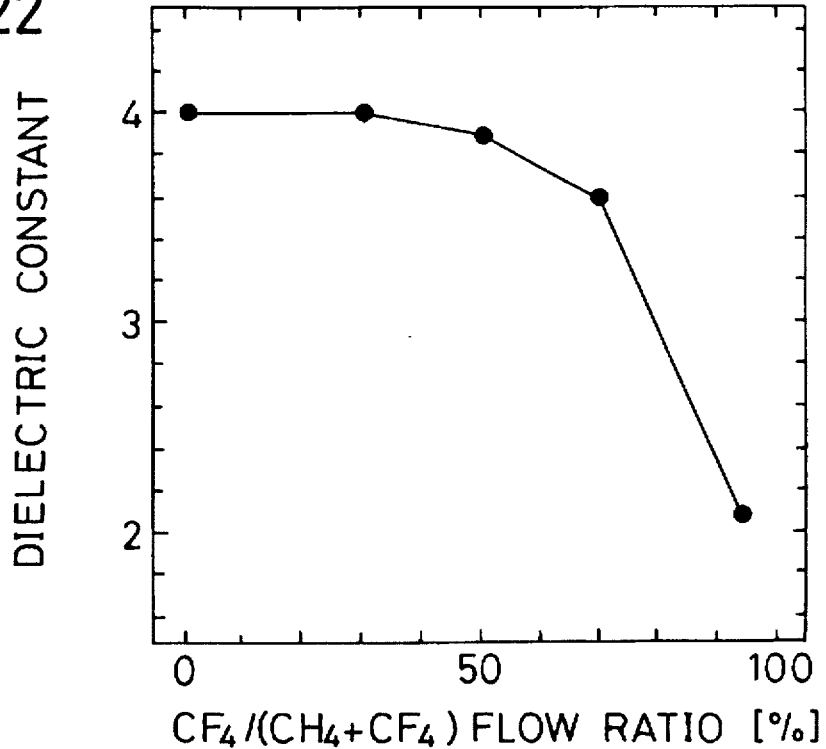
FIG. 22 is a graph showing a dielectric constant of a fluorinated amorphous carbon film deposited by using a parallel flat plate type plasma source.

In a conventional parallel flat plate type plasma generator, an amorphous carbon film is deposited on condition that total gas flow rate is kept to be 50 sccm, and high frequency electric power (13.56 MHz) of 200 W is applied to a mixture gas of $CF_4$ and $CH_4$. FIG. 21 shows a relationship between deposition speed and gas flow rate, and FIG. 22 shows a relationship between a dielectric constant of an amorphous carbon film and gas flow rate both in a conventional apparatus. The deposition speed and dielectric constant (1 MHz) of an amorphous carbon film vary in dependence on mixture rate of plasma source, and thus vary as shown in FIGS. 13 and 14. It is possible to obtain an amorphous carbon film having a dielectric constant smaller than 3 even by a conventional apparatus, however, the conventional apparatus provides only low deposition speed, which poses a problem of a small throughput.

Since it is considered that the use of highly densified plasma would increase an amount of radicals contributing to deposition with the result of higher deposition speed, the inventor had deposited an amorphous carbon film through the use of highly densified plasma generated by helicon waves. There was used 100 sccm of $CF_4$ gas and $C_2F_6$ gas, respectively, as plasma source which was diluted with hydrogen gas ($H_2$). High frequency electric power (13.56 MHz) used for producing helicon waves was fixed at 2 kW. The temperature of the support plate was cooled down to 50 degrees centigrade.

Figure 23:
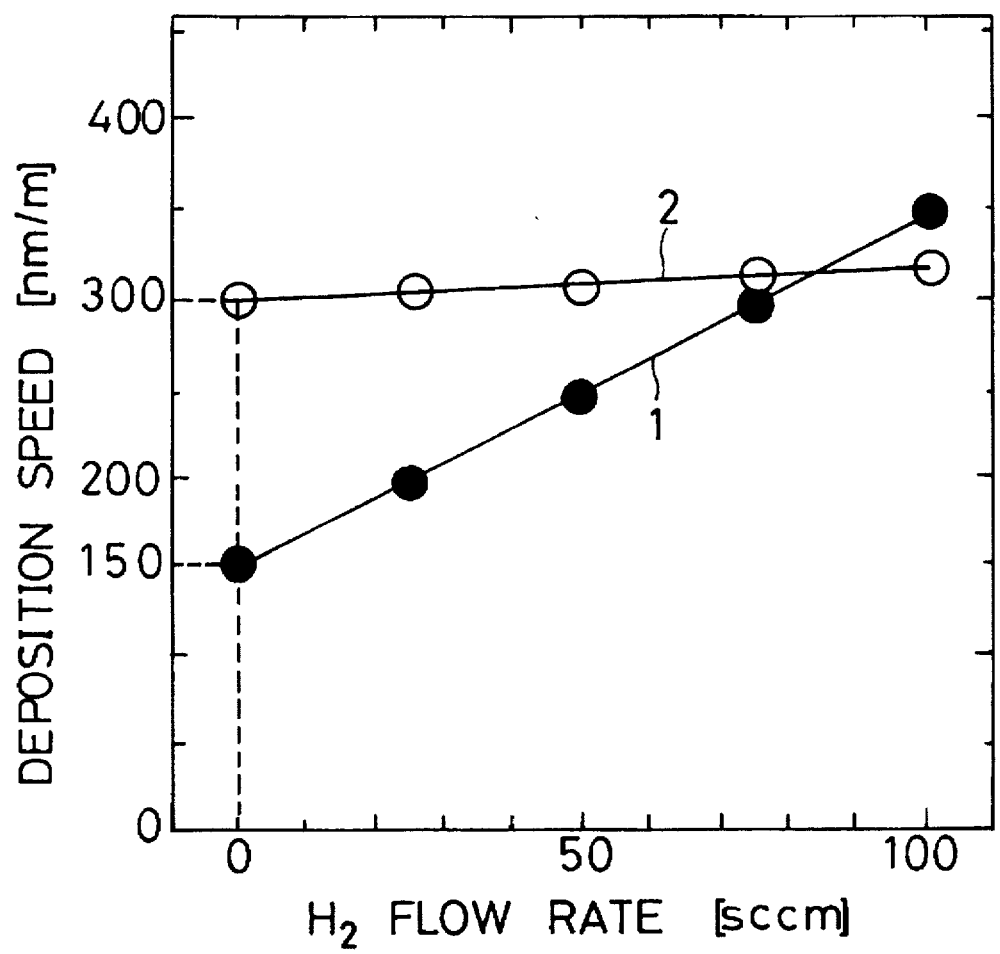
FIG. 23 is a graph showing the dependency of deposition speed on $H_2$ flow rate when helicon wave plasma source is used.

FIG. 23 shows the dependency of deposition speed on $H_2$ flow rate. The curve 1 indicates the dependency when $CF_4$ gas was used, while the curve 2 indicates the dependency when $C_2F_6$ gas was used. As results of measurement, the electron density was found to be $5\times10^{12}$ cm$^{-3}$, and plasma potential was found to be 20 V. As will be understood from FIG. 23, the use of helicon plasma makes it possible to deposit a fluorinated amorphous carbon film without addition of hydrogen. That is, the deposition speeds of about 150 nm/min (curve 1) and about 300 nm/min (curve 2) were obtained when $H_2$ flow rate is zero. (As earlier mentioned, in a conventional apparatus, when $H_2$ flow rate was zero, the deposition speed was also zero.)

Namely, the inventor has found that the use of highly densified plasma in which a substrate is disposed separately from plasma generating region makes it possible to deposit a fluorinated amorphous carbon film consisting of carbon and fluorine atoms. In addition, the inventor has also established the method by which deposition speed of an amorphous carbon film can be increased about ten times greater than deposition speed obtained by a conventional parallel flat plate type apparatus.

The inventor had also deposited an amorphous carbon film through the use of highly densified plasma generated by microwaves. Them was used 100 sccm of $CF_4$ gas and $C_2F_6$ gas, respectively, as plasma source which was diluted with hydrogen gas ($H_2$). Microwave electric power (2.45 GHz) used for producing microwaves was kept to be 2 kW. The temperature of the support plate was cooled down to 50 degrees centigrade.

Figure 24:
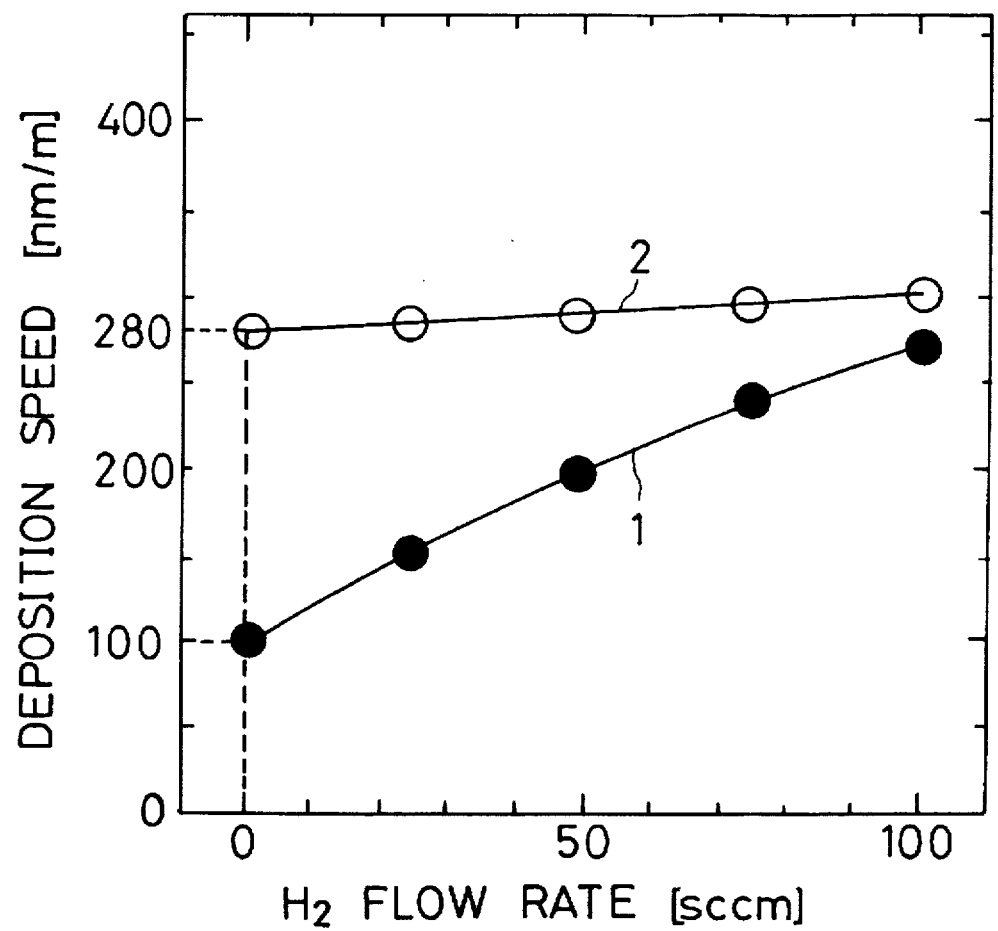
FIG. 24 is a graph showing the dependency of deposition speed on $H_2$ flow rate when microwave plasma source is used.

FIG. 24 shows the dependency of deposition speed on $H_2$ flow rate. The curve 1 indicates the dependency when $CF_4$ gas was used, while the curve 2 indicates the dependency when $C_2F_6$ gas was used. As results of measurement, the electron density was found to be $2\times10^{12}$ cm$^{-3}$, and plasma potential was found to be 16 V. As will be understood from FIG. 24, the use of microwave plasma makes it possible to deposit a fluorinated amorphous carbon film without addition of hydrogen. That is, the deposition speeds of about 100 nm/min (curve 1) and about 280 nm/min (curve 2) were obtained when $H_2$ flow rate is zero. (As earlier mentioned, in a conventional apparatus, when $H_2$ flow rate was zero, the deposition speed was also zero.) The deposition speed obtained when $H_2$ flow rate is zero is smaller than the deposition speed obtained by the above mentioned helicon plasma, but is much greater than the deposition speed obtained by a conventional parallel flat plate type apparatus.

The reason why the use of highly densified plasma can remarkably enhance the deposition speed relative to that of the conventional parallel flat plate type apparatus is considered that density of radicals which contribute to deposition of the film is increased relative to the conventional parallel flat plate type apparatus. The reason why a fluorinated amorphous carbon film can be deposited without dilution with hydrogen is considered that these highly densified plasma sources are accelerated in accordance with a difference in potential between the substrate and the plasma, and hence energy of ions irradiated to the amorphous carbon film can be made smaller than that of the conventional parallel flat plate type apparatus with the result that etching can be suppressed.

In the above mentioned embodiments, the process gases $CF_4$ and $C_2F_6$ are used for deposition of the amorphous carbon film. However, it should be noted that the process gas is not limited to those, and that other carbon fluoride gases such as $C_3F_8$ and $C_4F_8$ may be used. In the experiments which had been carried out by the inventor, when carbon fluoride gas such as $C_3F_8$ and $C_4F$ was used, the conventional parallel flat plate type apparatus could not deposit an amorphous carbon film. On the other hand, the use of highly densified plasma made it possible to deposit an amorphous carbon film with carbon fluoride gas such as $C_3F_8$ and $C_4F$. In addition, the deposition speed was the same as that obtained when $C_2F_6$ gas was used.

The inventor had also investigated how quality of the amorphous carbon film is influenced by varying energy of ions irradiated to a specimen. The specimen was fabricated without hydrogen gas, but only with $CF_4$ and $C_2F_6$ gases. The ion energy was varied by applying high frequency voltage (400 KHz) to the support plate to thereby control a voltage of the specimen. A temperature of the support plate was kept to be 50 degrees centigrade. In a conventional parallel flat plate type apparatus, since a self-bias voltage is applied to a specimen placed on an electrode, it was difficult to control ion energy by controlling a bias voltage. However, the use of highly densified plasma such as helicon wave and microwave and the arrangement of deposition area being separately disposed from plasma generation area make it possible to control a voltage of the support plate by applying high frequency electric power to the support plate, and thus also possible to control energy of ions irradiated to a substrate.

Figure 25:
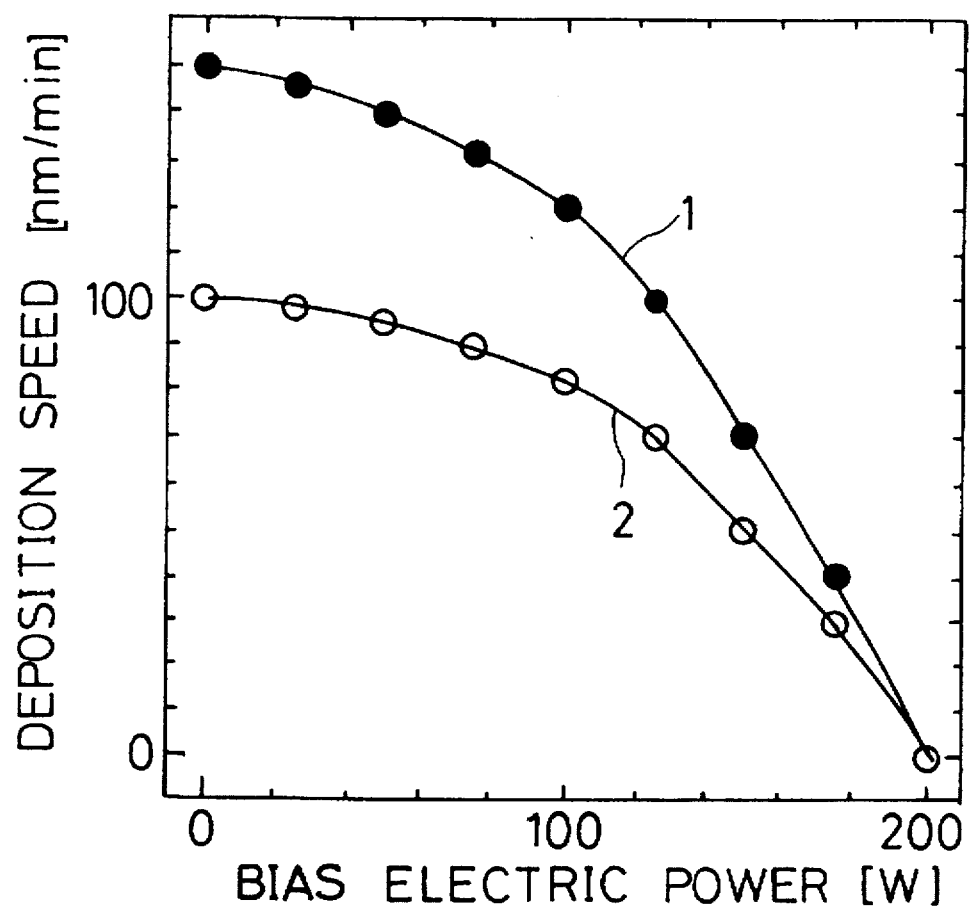
FIG. 25 is a graph showing the dependency of deposition speed on a bias electric power.

FIG. 25 shows how the deposition speed of the amorphous carbon film deposited using $CF_4$ gas varies as the high frequency bias electric power varies. The curve 1 indicates the deposition speed of the film deposited using helicon wave, while the curve 2 indicates the deposition speed of the film deposited using microwave. It has been found that as bias voltage increases, the deposition speeds decrease, and that an amorphous carbon film can not be deposited if bias electric power is over 200 W. The reason of this phenomenon is considered that since ion energy increases as the bias electric power increases, etching is facilitated. The reason why an amorphous carbon film was not deposited only with CF family gas in a conventional parallel flat plate type apparatus is considered that there exist ions having energy corresponding to energy obtained when bias electric power of 200 W or greater is applied by the highly densified plasma source. It was also observed that while an amorphous carbon film is being deposited with carbon fluoride gases such as $C_3F_8$ and $C_4F_8$ by using the highly densified plasma, the deposition speed of the film is decreased by applying a bias voltage to the specimen.

How heat resistance, dielectric constant and pattern-filling characteristic of the amorphous carbon film were influenced by bias electric power application was tested. Specifically, the followings were measured: a temperature at which the amorphous carbon film begins to be decomposed, and thus weight of the film begins to decrease when the film is heated in vacuum atmosphere, fluorine content in the film, and a dielectric constant (1 MHz) of the film. The results are shown in the following table.

|  | Plasma | Gas | Bias [W] | D.C. | F [%] | D. Speed [μm/min] | H.R. [°C.] |
| --- | --- | --- | --- | --- | --- | --- | --- |
| Reference | F | $CH_4$ + $CF_4$ | — | 2.1 | 54 | 0.035 | 280 |
| Sample 1 | H | $CF_4$ | 0 | 2.3 | 55 | 0.3 | 300 |
| Sample 2 | H | $CF_4$ | 100 | 2.4 | 52 | 0.15 | 380 |
| Sample 3 | H | $CF_4$ | 150 | 2.5 | 51 | 0.13 | 400 |
| Sample 4 | H | $C_2F_6$ | 0 | 2.4 | 53 | 0.10 | 330 |
| Sample 5 | H | $C_2F_6$ | 100 | 2.5 | 50 | 0.28 | 410 |
| Sample 6 | H | $C_2F_6$ | 150 | 2.6 | 48 | 0.25 | 470 |
| Sample 7 | M | $CF_4$ | 0 | 2.2 | 58 | 0.1 | 280 |
| Sample 8 | M | $CF_4$ | 100 | 2.3 | 56 | 0.08 | 300 |
| Sample 9 | M | $CF_4$ | 150 | 2.4 | 53 | 0.05 | 340 |
| Sample 10 | M | $C_2F_6$ | 0 | 2.3 | 55 | 0.28 | 300 |
| Sample 11 | M | $C_2F_6$ | 100 | 2.4 | 52 | 0.26 | 380 |
| Sample 12 | M | $C_2F_6$ | 150 | 2.5 | 50 | 0.23 | 410 |

In the above table, F, H and M means parallel flat plate type plasma, helicon wave plasma, and microwave plasma, respectively. D.C. means a dielectric constant, F means fluorine (F) content, D. Speed means deposition speed of an amorphous carbon film, and H.R. means heat resistance of an amorphous carbon film.

As is understood from the above table, it has been found that the application of bias voltage enhances the heat resistance of the amorphous carbon film. That is, the inventor has found that the use of highly densified plasma and application of high frequency electric power to a specimen during the deposition are quite helpful for enhancement of the heat resistance of the fluorinated amorphous carbon film. It has also been found that fluorine content in the film is decreased by applying bias electric power for increasing irradiation energy. The decrease of fluorine content in the film facilitates formation of carbon-carbon bonding in the film, which is considered to contribute to increasing cross-linking degree of the film. The heat resistance of a film is in general dependent on crosslinking degree of a structure of the film. Accordingly, enhancement of the heat resistance by application of a bias voltage is considered due to increased crosslinking degree of the film. It is considered that in a conventional parallel flat plate type apparatus listed as a reference case in the above table, to a film are irradiated ions having energy corresponding to energy obtained when a bias voltage is applied with highly densified plasma. The reason why the film in a reference case has low heat resistance regardless of such irradiation of ions thereto is considered that hydrogen gas has to be used in deposition of the film, and hence some hydrogen atoms are desorbed in the film at lower temperature.

The fluorinated amorphous carbon film was deposited on a silicon substrate on which aluminum wirings had been already patterned in conventional manner. Then, how degree the fluorinated amorphous carbon film can be filled in spacings among the patterned wirings was observed. The deposition of the film was carried out on condition that wirings constituting a pattern have a width of 0.4 μm, a spacing between adjacent wirings is 0.4 mm, and a height of wirings is 0.8 μm. When an amorphous carbon film was deposited through the use of helicon wave or microwave without application of a bias voltage to a substrate, even if any gas among $CF_4$, $C_2F_6$, $C_3F_8$ and $C_4F_8$ was used, the pattern was not able to be filled with the amorphous carbon film, and hence some voids were found among wirings. On the other hand, when the deposition of an amorphous carbon film was carried out with a bias voltage applied to the substrate, the pattern was sufficiently filled with the fluorinated amorphous carbon film without occurrence of voids. In general, voids are generated when an amorphous carbon film has smaller deposition speed to deposit on a side wall of material such as aluminum for formation of wirings than deposition speed to deposit on a top surface of the material. The reason why application of a bias electric power is helpful for filling a pattern with an amorphous carbon film is considered that the application of a bias electric power accelerates ions and thus selectively facilitates only etching which occurs on the wiring material with the result of reduction of a difference between the deposition speed of the film to deposit on a side wall of wiring material and the deposition speed of the film to deposit on a top surface of the wiring material.

Though helicon wave and microwave are used in the above mentioned embodiments, any plasma source may be used if that plasma is highly densified, and further if a substrate on which an amorphous carbon film is to deposit is disposed separately from plasma generation area. For instance, inductive coupling type plasma may be selected.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor device comprising interlayer insulative layers composed of amorphous carbon film including fluorine (F), wherein a content of said fluorine has a distribution in a depthwise direction of said amorphous carbon film such that said fluorine decreases in said depthwise direction.

2. The semiconductor device as recited in claim 1, wherein said distribution is designed so that no fluorine (F) is present at an interface between said amorphous carbon film and an underlying layer disposed below said amorphous carbon film.

3. The semiconductor device as recited in claim 1, wherein said amorphous carbon film further includes silicon (Si).

4. The semiconductor device as recited in claim 1, further including a buffer layer for suppressing gas discharge out of said amorphous carbon film, said buffer layer being disposed between said amorphous carbon film and elements of said semiconductor device disposed adjacent to said amorphous carbon film.

5. The semiconductor device as retired in claim 4, wherein said elements of said semiconductor device includes an electrode, a wiring and a transistor section.

6. The semiconductor device recited in claim 4 further including a transition layer interposed between said amorphous carbon film and said buffer layer, said transition layer having a composition gradually varying from a composition of said amorphous carbon film to a composition of said buffer layer.

7. The semiconductor device recited in claim 4, wherein said buffer layer has a smaller thickness than that of said amorphous carbon film.

8. The semiconductor device recited in claim 4, wherein said buffer layer has a thickness determined in accordance with a temperature of a heat treatment to be carried out in fabrication of said semiconductor device.

9. The semiconductor device recited in claim 4, wherein said buffer layer is composed of one of $SiO_2$, $Si_3N_4$, amorphous carbon film including silicon therein, and amorphous carbon film including nitrogen therein.

10. A semiconductor device in which interlayer insulative layers are composed of amorphous carbon film which includes fluorine (F) and nitrogen (N).

11. A semiconductor device comprising:
   an interlayer insulative layer composed of amorphous carbon film;
   a buffer layer for suppressing gas discharge out of said amorphous carbon film, said buffer layer being disposed between said amorphous carbon film and elements of said semiconductor device disposed adjacent to said amorphous carbon film; and
   a transition layer interposed between said amorphous carbon film and said buffer layer, said transition layer having a composition gradually varying from a composition of said amorphous carbon film to a composition of said buffer layer.

12. The semiconductor device recited in claim 11, wherein said elements of said semiconductor device includes an electrode, a wiring and a transistor section.

* * * * *